US007133853B2

(12) United States Patent
Richardson et al.

(10) Patent No.: US 7,133,853 B2
(45) Date of Patent: Nov. 7, 2006

(54) METHODS AND APPARATUS FOR DECODING LDPC CODES

(75) Inventors: Tom Richardson, South Orange, NJ (US); Vladimir Novichkov, Glenview, IL (US)

(73) Assignee: Qualcomm Incorporated, San Diego, CA (US)

( * ) Notice: Subject to any disclaimer, the term of this patent is extended or adjusted under 35 U.S.C. 154(b) by 378 days.

(21) Appl. No.: 10/626,057

(22) Filed: Jul. 24, 2003

(65) Prior Publication Data

US 2005/0278606 A1 Dec. 15, 2005

Related U.S. Application Data

(63) Continuation of application No. 09/975,331, filed on Oct. 10, 2001, now Pat. No. 6,633,856
(60) Provisional application No. 60/298,480, filed on Jun. 15, 2001.

(51) Int. Cl.
*G06N 5/00* (2006.01)

(52) U.S. Cl. ............................................. 706/15; 714/4

(58) Field of Classification Search .................... 706/15; 714/762, 797, 4; 370/448
See application file for complete search history.

(56) References Cited

U.S. PATENT DOCUMENTS 3,542,756 A 11/1970 Gallager et al.
3,665,396 A 5/1972 Forney, Jr.

(Continued)

OTHER PUBLICATIONS

NN77112415. Digital Encoding of Wide Range Dynamic Analog Signals, IBM Tech. Disclosure Bulletin, Nov. 1, 1997, vol. No. 20; Issue No. 6; pp. 2415–2417, whole document.

Sorokine, V. et al. Innovative coding scheme for spread-spectrum communications, The Ninth IEEE International Symposium on Indoor and Mobile Radio Communications, pp: 1491–1495, vol. 3; Sep. 1998, whole document.

NN9210335. Hierarchical Coded Modulation of Data with Fast Decaying Probability Distributions, IBM Tech. Disclosure Bulletin, Oct. 1992, vol. No. 35; Issue No. 5; pp. 335–336, whole document.

(Continued)

*Primary Examiner*—Wilbert L. Starks, Jr.
(74) *Attorney, Agent, or Firm*—Straub & Pokotylo; Michael P. Straub

(57) ABSTRACT

Methods and apparatus for decoding codewords using message passing decoding techniques which are particularly well suited for use with low density parity check (LDPC) codes and long codewords are described. The described methods allow decoding graph structures which are largely comprised of multiple identical copies of a much smaller graph. Copies of the smaller graph are subject to a controlled permutation operation to create the larger graph structure. The same controlled permutations are directly implemented to support message passing between the replicated copies of the small graph. Messages corresponding to individual copies of the graph are stored in a memory and accessed in sets, one from each copy of the graph, using a SIMD read or write instruction. The graph permutation operation may be implemented by simply reordering messages, e.g., using a cyclic permutation operation, in each set of messages read out of a message memory so that the messages are passed to processing circuits corresponding to different copies of the small graph.

28 Claims, 13 Drawing Sheets

U.S. PATENT DOCUMENTS

| | | | | |
|---|---|---|---|---|
| 4,295,218 | A | * | 10/1981 | Tanner ........................ 714/762 |
| 4,561,092 | A | * | 12/1985 | Shaver ........................ 370/448 |
| 4,914,657 | A | * | 4/1990 | Walter et al. ................... 714/4 |
| 4,972,415 | A | * | 11/1990 | Walter et al. ............... 714/797 |
| 5,157,671 | A | | 10/1992 | Karplus |
| 5,271,042 | A | | 12/1993 | Borth et al. |
| 5,293,489 | A | | 3/1994 | Furui et al. |
| 5,313,609 | A | | 5/1994 | Baylor et al. |
| 5,396,518 | A | | 3/1995 | How |
| 5,457,704 | A | | 10/1995 | Hoeher et al. |
| 5,526,501 | A | | 6/1996 | Shams |
| 5,615,298 | A | | 3/1997 | Chen |
| 5,671,221 | A | | 9/1997 | Yang |
| 5,860,085 | A | | 1/1999 | Stormon et al. |
| 5,864,703 | A | | 1/1999 | Van Hook et al. |
| 5,867,538 | A | | 2/1999 | Liu |
| 5,892,962 | A | | 4/1999 | Cloutier |
| 5,933,650 | A | | 8/1999 | Van Hook et al. |
| 5,968,198 | A | | 10/1999 | Hassan |
| 6,002,881 | A | | 12/1999 | York et al. |
| 6,073,250 | A | | 6/2000 | Luby et al. |
| 6,195,777 | B1 | | 2/2001 | Luby et al. |
| 6,247,158 | B1 | | 6/2001 | Smallcomb |
| 6,266,758 | B1 | | 7/2001 | Van Hook et al. |
| 6,298,438 | B1 | | 10/2001 | Thayer et al. |
| 6,339,834 | B1 | | 1/2002 | Crozier et al. |
| 6,397,240 | B1 | | 5/2002 | Fernando et al. |
| 6,438,180 | B1 | | 8/2002 | Kavcic et al. |
| 6,473,010 | B1 | | 10/2002 | Vityaev et al. |
| 6,484,284 | B1 | | 11/2002 | Smallcomb |
| 6,526,538 | B1 | | 2/2003 | Hewitt |
| 6,633,856 | B1 | | 10/2003 | Richardson et al. |
| 6,718,504 | B1 | | 4/2004 | Coombs et al. |
| 6,731,700 | B1 | | 5/2004 | Yakhnich et al. |
| 6,754,804 | B1 | | 6/2004 | Hudepohl et al. |
| 2004/0034828 | A1 | | 2/2004 | Hocevar |

OTHER PUBLICATIONS

Paranchych et al. Performance of a digital symbol synchronizer in cochannel interference and noise, IEEE Transactions on Communications, pp: 1945–1954; Nov. 2000, whole document.

T. Moors and M. Veeraraghavan, "Preliminary specification and explanation of Zing: An end–to–end protocol for transporting bulk data over optical circuits", pp. 1–55 (May 2001).

T. Richardson and R. Urbanke, "The Capacity of Low–Density Parity–Check Codes under Message–Passing Decoding", pp. 1–44 (Mar. 2001).

T. Richardson, a. Shokrollahi, R. Urbanke, "Design of Capacity–Approaching Irregular Low–Density Parity–Check Codes", pp. 1–43 (Mar. 2001).

Richardson et al. The capacity of low–density parity–check codes under message–passing Decoding, IEEE Transactions on Information Theory; pp: 599–618, Feb. 2001, (same inventor) whole document.

T. Richardson and R. Urbanke, "An Introduction to the Analysis of Iterative Coding Systems", pp. 1–36.

Saied Hemati, Amir H. Banihashemi, VSLI circuits: Iterative decoding in analog CMOS, Proceedings of the $13^{th}$ ACM Great Lakes Symposium on VSLI Apr. 2003, pp. 15–20.

Mohammad M. Mansour, Naresh R. Shanbhag, Session 11: Low–power VLSI decoder architectures for LDPC codes, Proceedings of the 2002 international symposium on Low power eletronics and design Aug. 2002, pp. 284–289.

W. W. Peterson and E.J. Weldon, Jr., "Error–Correcting Codes", Second Edition, The Massachusettes Institute of Technology, pp. 212–213, 261–263, 263, (1986).

* cited by examiner $$H = \begin{bmatrix} 1 & 1 & 1 & 1 & 0 & 1 & 1 & 0 & 0 & 0 \\ 0 & 0 & 1 & 1 & 1 & 0 & 1 & 1 & 0 & 1 \\ 0 & 1 & 0 & 1 & 0 & 1 & 0 & 1 & 1 & 1 \\ 1 & 0 & 1 & 0 & 1 & 1 & 0 & 1 & 1 & 0 \\ 1 & 1 & 0 & 0 & 1 & 0 & 1 & 0 & 1 & 1 \end{bmatrix} \quad X = \begin{bmatrix} X_1 \\ X_2 \\ X_3 \\ X_4 \\ X_5 \\ X_6 \\ X_7 \\ X_8 \\ X_9 \\ X_{10} \end{bmatrix} \quad \begin{bmatrix} 1_1 & 1_4 & 1_7 & 1_{10} & 0 & 1_{16} & 1_{19} & 0 & 0 & 0 \\ 0 & 0 & 1_8 & 1_{11} & 1_{13} & 0 & 1_{20} & 1_{22} & 0 & 1_{28} \\ 0 & 1_5 & 0 & 1_{12} & 0 & 1_{17} & 0 & 1_{23} & 1_{25} & 1_{29} \\ 1_2 & 0 & 1_9 & 0 & 1_{14} & 1_{18} & 0 & 1_{24} & 1_{26} & 0 \\ 1_3 & 1_6 & 0 & 0 & 1_{15} & 0 & 1_{21} & 0 & 1_{27} & 1_{30} \end{bmatrix}$$

$$\begin{bmatrix} 1_1 & 1_2 & 1_3 & 1_4 & 0 & 1_5 & 1_6 & 0 & 0 & 0 \\ 0 & 0 & 1_7 & 1_8 & 1_9 & 0 & 1_{10} & 1_{11} & 0 & 1_{12} \\ 0 & 1_{13} & 0 & 1_{14} & 0 & 1_{15} & 0 & 1_{16} & 1_{17} & 1_{18} \\ 1_{19} & 0 & 1_{20} & 0 & 1_{21} & 1_{22} & 0 & 1_{23} & 1_{24} & 0 \\ 1_{25} & 1_{26} & 0 & 0 & 1_{27} & 0 & 1_{28} & 0 & 1_{29} & 1_{30} \end{bmatrix}$$

Figure 2

Figure 6
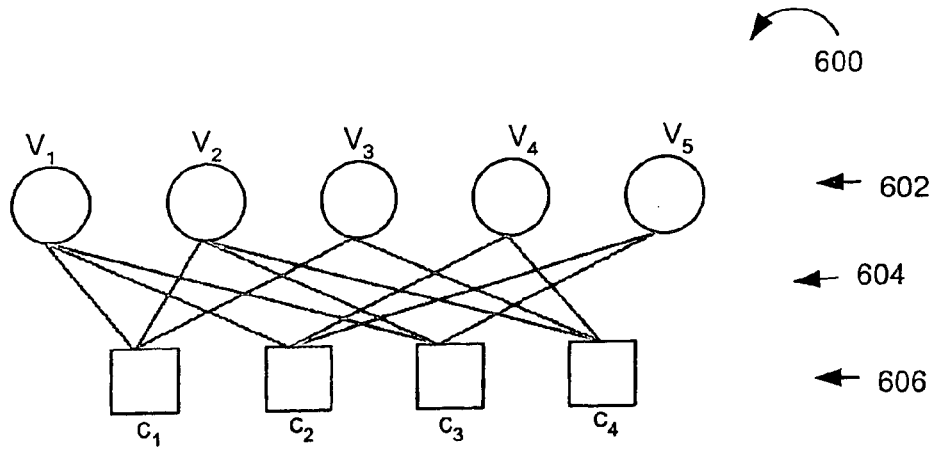
Figure 7
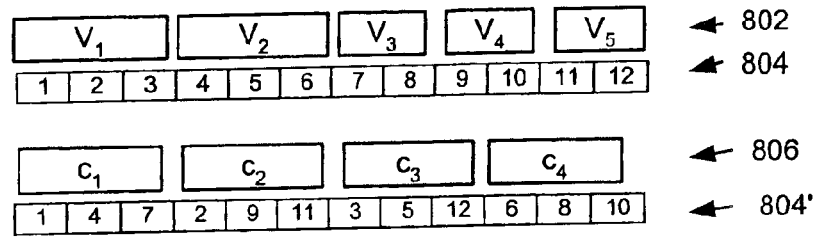
Edge permutation representation - edges enumerated from variable node side.
Figure 8

|     | $V_1$ | | | $V_2$ | | | $V_3$ | | | $V_4$ | | $V_5$ | |
| --- | --- | --- | --- | --- | --- | --- | --- | --- | --- | --- | --- | --- | --- |
| $v_1$ | 1,1 | 1,2 | 1,3 | 1,4 | 1,5 | 1,6 | 1,7 | 1,8 | 1,9 | 1,10 | 1,11 | 1,12 | ← 1202' |
| $v_2$ | 2,1 | 2,2 | 2,3 | 2,4 | 2,5 | 2,6 | 2,7 | 2,8 | 2,9 | 2,10 | 2,11 | 2,12 | ← 1202" |
| $v_3$ | 3,1 | 3,2 | 3,3 | 3,4 | 3,5 | 3,6 | 3,7 | 3,8 | 3,9 | 3,10 | 3,11 | 3,12 | ← 1202''' |

|     | $c_1$ | | | $c_2$ | | | $c_3$ | | | $c_4$ | | | |
| --- | --- | --- | --- | --- | --- | --- | --- | --- | --- | --- | --- | --- | --- |
| $c_1$ | 1,1 | 1,4 | 1,7 | 1,2 | 1,9 | 1,11 | 1,3 | 1,5 | 1,12 | 1,6 | 1,8 | 1,10 | ← 1204' |
| $c_2$ | 2,1 | 2,4 | 2,7 | 2,2 | 2,9 | 2,11 | 2,3 | 2,5 | 2,12 | 2,6 | 2,8 | 2,10 | ← 1204" |
| $c_3$ | 3,1 | 3,4 | 3,7 | 3,2 | 3,9 | 3,11 | 3,3 | 3,5 | 3,12 | 3,6 | 3,8 | 3,10 | ← 1204''' |

Figure 12

| | $x_1$ | | | $x_2$ | | | $x_3$ | | | $x_4$ | | | $x_5$ | | |
|---|---|---|---|---|---|---|---|---|---|---|---|---|---|---|---|
| $x_1$ | 1,1 | 1,2 | 1,3 | 1,4 | 1,5 | 1,6 | 1,7 | 1,8 | 1,9 | 1,10 | 1,11 | 1,12 | | | ← 1402' |
| $x_2$ | 2,1 | 2,2 | 2,3 | 2,4 | 2,5 | 2,6 | 2,7 | 2,8 | 2,9 | 2,10 | 2,11 | 2,12 | | | ← 1402'' |
| $x_3$ | 3,1 | 3,2 | 3,3 | 3,4 | 3,5 | 3,6 | 3,7 | 3,8 | 3,9 | 3,10 | 3,11 | 3,12 | | | ← 1402''' |

| | $c_1$ | | | $c_2$ | | | $c_3$ | | | $c_4$ | | | |
|---|---|---|---|---|---|---|---|---|---|---|---|---|---|
| $c_1$ | 2,1 | 2,4 | 3,7 | 3,2 | 1,9 | 1,11 | 1,3 | 3,5 | 2,12 | 1,6 | 2,8 | 3,10 | ← 1404' |
| $c_2$ | 3,1 | 3,4 | 1,7 | 1,2 | 2,9 | 2,11 | 2,3 | 1,5 | 3,12 | 2,6 | 3,8 | 1,10 | ← 1404'' |
| $c_3$ | 1,1 | 1,4 | 2,7 | 2,2 | 3,9 | 3,11 | 3,3 | 2,5 | 1,12 | 3,6 | 1,8 | 2,10 | ← 1404''' |

METHODS AND APPARATUS FOR DECODING LDPC CODES

RELATED APPLICATIONS

This application is a continuation of U.S. patent application Ser. No. 09/975,331 filed Oct. 10, 2001 which issued as U.S. Pat. No. 6,633,856, and which claims the benefit of U.S. Provisional Application Ser. No. 60/298,480 filed on Jun. 15, 2001.

FIELD OF THE INVENTION

The present invention is directed to methods and apparatus for detecting and/or correcting errors in binary data, e.g., through the use of parity check codes such as low density parity check (LDPC) codes.

BACKGROUND

In the modern information age binary values, e.g., ones and zeros, are used to represent and communicate various types of information, e.g., video, audio, statistical information, etc. Unfortunately, during storage, transmission, and/or processing of binary data, errors may be unintentionally introduced, e.g., a one may be changed to a zero or vice versa.

Generally, in the case of data transmission, a receiver observes each received bit in the presence of noise or distortion and only an indication of the bit's value is obtained. Under these circumstances one interprets the observed values as a source of "soft" bits. A soft bit indicates a preferred estimate of the bit's value, i.e., a one or a zero, together with some indication of that estimate's reliability. While the number of errors may be relatively low, even a small number of errors or level of distortion can result in the data being unusable or, in the case of transmission errors, may necessitate re-transmission of the data.

In order to provide a mechanism to check for errors and, in some cases, to correct errors, binary data can be coded to introduce carefully designed redundancy. Coding of a unit of data produces what is commonly referred to as a codeword. Because of its redundancy, a codeword will often include more bits than the input unit of data from which the codeword was produced.

When signals arising from transmitted codewords are received or processed, the redundant information included in the codeword as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data.

While data redundancy can increase the reliability of the data to be stored or transmitted, it comes at the cost of storage space and/or the use of valuable communications bandwidth. Accordingly, it is desirable to add redundancy in an efficient manner, maximizing the amount of error correction/detection capacity gained for a given amount of redundancy introduced into the data.

With the increased use of fiber optic lines for data communication and increases in the rate at which data can be read from and stored to data storage devices, e.g., disk drives, tapes, etc., there is an increasing need not only for efficient use of data storage and transmission capacity but also for the ability to encode and decode data at high rates of speed.

While encoding efficiency and high data rates are important, for an encoding and/or decoding system to be practical for use in a wide range of devices, e.g., consumer devices, it is important that the encoders and/or decoders be capable of being implemented at reasonable cost. Accordingly, the ability to efficiently implement encoding/decoding schemes used for error correction and/or detection purposes, e.g., in terms of hardware costs, can be important.

Various types of coding schemes have been used over the years for error correction purposes. One class of codes, generally referred to as "turbo codes" were recently invented (1993). Turbo codes offer significant benefits over older coding techniques such as convolutional codes and have found numerous applications.

In conjunction with the advent of turbo codes, there has been increasing interest in another class of related, apparently simpler, codes commonly referred to as low density parity check (LDPC) codes. LDPC codes were actually invented by Gallager some 40 years ago (1961) but have only recently come to the fore. Turbo codes and LDPC codes are coding schemes that are used in the context of so-called iterative coding systems, that is, they are decoded using iterative decoders. Recently, it has been shown that LDPC codes can provide very good error detecting and correcting performance, surpassing or matching that of turbo codes for large codewords, e.g., codeword sizes exceeding approximately 1000 bits, given proper selection of LDPC coding parameters. Moreover, LDPC codes can potentially be decoded at much higher speeds than turbo codes.

In many coding schemes, longer codewords are often more resilient for purposes of error detection and correction due to the coding interaction over a larger number of bits. Thus, the use of long codewords can be beneficial in terms of increasing the ability to detect and correct errors. This is particularly true for turbo codes and LDPC codes. Thus, in many applications the use of long codewords, e.g., codewords exceeding a thousand bits in length, is desirable.

The main difficulty encountered in the adoption of LDPC coding and Turbo coding in the context of long codewords, where the use of such codes offers the most promise, is the complexity of implementing these coding systems. In a practical sense, complexity translates directly into cost of implementation. Both of these coding systems are significantly more complex than traditionally used coding systems such as convolutional codes and Reed-Solomon codes.

Complexity analysis of signal processing algorithms usually focuses on operations counts. When attempting to exploit hardware parallelism in iterative coding systems, especially in the case of LDPC codes, significant complexity arises not from computational requirements but rather from routing requirements. The root of the problem lies in the construction of the codes themselves.

LDPC codes and turbo codes rely on interleaving messages inside an iterative process. In order for the code to perform well, the interleaving must have good mixing properties. This necessitates the implementation of a complex interleaving process.

LDPC codes are well represented by bipartite graphs, often called Tanner graphs, in which one set of nodes, the variable nodes, corresponds to bits of the codeword and the other set of nodes, the constraint nodes, sometimes called check nodes, correspond to the set of parity-check constraints which define the code. Edges in the graph connect variable nodes to constraint nodes. A variable node and a constraint node are said to be neighbors if they are connected by an edge in the graph. For simplicity, we generally assume that a pair of nodes is connected by at most one edge. To each variable node is associated one bit of the codeword. In some cases some of these bits might be punctured or known, as discussed further below.

A bit sequence associated one-to-one with the variable node sequence is a codeword of the code if and only if, for each constraint node, the bits neighboring the constraint (via their association with variable nodes) sum to zero modulo two, i.e., they comprise an even number of ones.

The decoders and decoding algorithms used to decode LDPC codewords operate by exchanging messages within the graph along the edges and updating these messages by performing computations at the nodes based on the incoming messages. Such algorithms will be generally referred to as message passing algorithms. Each variable node in the graph is initially provided with a soft bit, termed a received value, that indicates an estimate of the associated bit's value as determined by observations from, e.g., the communications channel. Ideally, the estimates for separate bits are statistically independent. This ideal can be, and often is, violated in practice. A collection of received values constitutes a received word. For purposes of this application we may identify the signal observed by, e.g., the receiver in a communications system with the received word.

The number of edges attached to a node, i.e., a variable node or constraint node, is referred to as the degree of the node. A regular graph or code is one for which all variable nodes have the same degree, j say, and all constraint nodes have the same degree, k say. In this case we say that the code is a (j,k) regular code. These were the codes considered originally by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

In order to more precisely describe the decoding process we introduce the notion of a socket in describing LDPC graphs. A socket can be viewed as an association of an edge in the graph to a node in the graph. Each node has one socket for each edge attached to it and the edges are "plugged into" the sockets. Thus, a node of degree d has d sockets attached to it. If the graph has L edges then there are L sockets on the variable node side of the graph, called the variable sockets, and L sockets on the constraint node side of the graph, called the constraint sockets. For identification and ordering purposes, the variable sockets may be enumerated 1, . . . ,L so that all variable sockets attached to one variable node appear contiguously. In such a case, if the first three variable nodes have degrees $d_1$, $d_2$, and $d_3$ respectively, then variable sockets 1, . . . ,$d_1$ are attached to the first variable node, variable sockets $d_1+1$, . . . , $d_1+d_2$ are attached to the second variable node, and variable sockets $d_1+d_2+1$, . . . , $d_1+d_2+d_3$ are attached to the third variable node. Constraint node sockets may be enumerated similarly 1, . . . ,L with all constraint sockets attached to one constraint node appearing contiguously. An edge can be viewed as a pairing of sockets, one of each pair coming from each side of the graph. Thus, the edges of the graph represent an interleaver or permutation on the sockets from one side of the graph, e.g., the variable node side, to the other, e.g., the constraint node side. The permutations associated with these systems are often complex, reflecting the complexity of the interleaver as indicated above, requiring complex routing of the message passing for their implementation.

The notion of message passing algorithms implemented on graphs is more general than LDPC decoding. The general view is a graph with nodes exchanging messages along edges in the graph and performing computations based on incoming messages in order to produce outgoing messages.

An exemplary bipartite graph 100 determining a (3,6) regular LDPC code of length ten and rate one-half is shown in FIG. 1. Length ten indicates that there are ten variable nodes $V_1$–$V_{10}$, each identified with one bit of the codeword $X_1$–$X_{10}$ (and no puncturing in this case), generally identified by reference numeral 102. Rate one half indicates that there are half as many check nodes as variable nodes, i.e., there are five check nodes $C_1$–$C_5$ identified by reference numeral 106. Rate one half further indicates that the five constraints are linearly independent, as discussed below. Each of the lines 104 represents an edge, e.g., a communication path or connection, between the check nodes and variable nodes to which the line is connected. Each edge identifies two sockets, one variable socket and one constraint socket. Edges can be enumerated according to their variable sockets or their constraint sockets. The variable sockets enumeration corresponds to the edge ordering (top to bottom) as it appears on the variable node side at the point where they are connected to the variable nodes. The constraint sockets enumeration corresponds to the edge ordering (top to bottom) as it appears on the constraint node side at the point they are connected to the constraint nodes. During decoding, messages are passed in both directions along the edges. Thus, as part of the decoding process messages are passed along an edge from a constraint node to a variable node and vice versa.

While FIG. 1 illustrates the graph associated with a code of length 10, it can be appreciated that representing the graph for a codeword of length 1000 would be 100 times more complicated.

An alternative to using a graph to represent codes is to use a matrix representation such as that shown in FIG. 2. In the matrix representation of a code, the matrix H 202, commonly referred to as the parity check matrix, includes the relevant edge connection, variable node and constraint node information. In the matrix H, each column corresponds to one of the variable nodes while each row corresponds to one of the column nodes. Since there are 10 variable nodes and 5 constraint nodes in the exemplary code, the matrix H includes 10 columns and 5 rows. The entry of the matrix corresponding to a particular variable node and a particular constraint node is set to 1 if an edge is present in the graph, i.e., if the two nodes are neighbors, otherwise it is set to 0. For example, since variable node $V_1$ is connected to constraint node $C_1$ by an edge, a one is located in the uppermost lefthand corner of the matrix 202. However, variable node $V_4$ is not connected to constraint node $C_1$ so a 0 is positioned in the fourth position of the first row of matrix 202 indicating that the corresponding variable and constraint nodes are not connected. We say that the constraints are linearly independent if the rows of H are linearly independent vectors over GF[2] (a Galois field of order 2). Enumerating edges by sockets, variable or constraint, corresponds to enumerating the 1's in H. Variable socket enumeration corresponds to enumerating top to bottom within columns and proceeding left to right from column to column, as shown in matrix 208. Constraint socket enumeration corresponds to enumerating left to right across rows and proceeding top to bottom from row to row, as shown in matrix 210.

In the case of a matrix representation, the codeword X which is to be transmitted can be represented as a vector 206 which includes the bits $X_1$–$X_n$ of the codeword to be processed. A bit sequence $X_1$–$X_n$ is a codeword if and only if the product of the matrix 206 and 202 is equal to zero, that is: Hx=0.

In the context of discussing codewords associated to LDPC graphs, it should be appreciated that in some cases the codeword may be punctured. Puncturing is the act of removing bits from a codeword to yield, in effect, a shorter codeword. In the case of LDPC graphs this means that some of the variable nodes in the graph correspond to bits that are not actually transmitted. These variable nodes and the bits associated with them are often referred to as state variables. When puncturing is used, the decoder can be used to reconstruct the portion of the codeword which is not physically communicated over a communications channel. Where a punctured codeword is transmitted the receiving device may initially populate the missing received word values (bits) with ones or zeros assigned, e.g., in an arbitrary fashion, together with an indication (soft bit) that these values are completely unreliable, i.e., that these values are erased. For purposes of explaining the invention, we shall assume that, when used, these receiver-populated values are part of the received word which is to be processed.

Consider for example the system 350 shown in FIG. 3. The system 350 includes an encoder 352, a decoder 357 and a communication channel 356. The encoder 350 includes an encoding circuit 353 that processes the input data A to produce a codeword X. The codeword X includes, for the purposes of error detection and/or correction, some redundancy. The codeword X may be transmitted over the communications channel. Alternatively, the codeword X can be divided via a data selection device 354 into first and second portions X', X" respectively by some data selection technique. One of the codeword portions, e.g., the first portion X', may then be transmitted over the communications channel to a receiver including decoder 357 while the second portion X" is punctured. As a result of distortions produced by the communications channel 356, portions of the transmitted codeword may be lost or corrupted. From the decoder's perspective, punctured bits may be interpreted as lost.

At the receiver soft bits are inserted into the received word to take the place of lost or punctured bits. The inserted indicating erasure of X" soft bits indicate and/or bits lost in transmission.

The decoder 357 will attempt to reconstruct the full codeword X from the received word Y and any inserted soft bits, and then perform a data decoding operation to produce A from the reconstructed codeword X.

The decoder 357 includes a channel decoder 358 for reconstructing the complete codeword X from the received word Y. In addition it includes a data decoder 359 for removing the redundant information included in the codeword to produce the original input data A from the reconstructed codeword X.

It will be appreciated that received words generated in conjunction with LDPC coding, can be processed by performing LDPC decoding operations thereon, e.g., error correction and detection operations, to generate a reconstructed version of the original codeword. The reconstructed codeword can then be subject to data decoding to recover the original data that was coded. The data decoding process may be, e.g., simply selecting a specific subset of the bits from the reconstructed codeword.

LDPC decoding operations generally comprise message passing algorithms. There are many potentially useful message passing algorithms and the use of such algorithms is not limited to LDPC decoding. The current invention can be applied in the context of virtually any such message passing algorithm and therefore can be used in various message passing systems of which LDPC decoders are but one example.

For completeness we will give a brief mathematical description of one realization of one of the best known message passing algorithms, known as belief propagation.

Belief propagation for (binary) LDPC codes can be expressed as follows. Messages transmitted along the edges of the graph are interpreted as log-likelihoods $$\log \frac{p_0}{p_1}$$

for the bit associated to the variable node. Here, $(p_0,p_1)$ represents a conditional probability distribution on the associated bit. The soft bits provided to the decoder by the receiver are also given in the form of a log-likelihood. Thus, the received values, i.e., the elements of the received word, are log-likelihoods of the associated bits conditioned on the observation of the bits provided by the communication channel. In general, a message m represents the log-likelihood m and a received value y represents the log-likelihood y. For punctured bits the received value y is set to 0, indicating $p_0=p_1=\frac{1}{2}$.

Let us consider the message-passing rules of belief propagation. Messages are denoted by $m^{C2V}$ for messages from check nodes to variable nodes and by $m^{V2C}$ for messages from variable nodes to check nodes. Consider a variable node with d edges. For each edge j=1, . . . ,d let $m^{C2V}(i)$ denote the incoming message on edge i. At the very beginning of the decoding process we set $m^{C2V}=0$ for every edge. Then, outgoing messages are given by $$m^{V2C}(j) = y + \sum_{i=1}^{d} m^{C2V}(i) - m^{C2V}(j).$$

At the check nodes it is more convenient to represent the messages using their 'sign' and magnitudes. Thus, for a message m let $m_p \epsilon GF[2]$ denote the 'parity' of the message, i.e., $m_p=0$ if $m \geq 0$ and $m_p=1$ if m<0. Additionally let $m_r \epsilon[0,\infty]$ denote the magnitude of m. Thus, we have $m=-1^{m_p}m_r$. At the check node the updates for $m_p$ and $m_r$ are separate. We have, for a check node of degree d, $$m_p^{C2V}(j) = \left(\sum_{i=1}^{d} m_p^{V2C}(i)\right) - m_p^{V2C}(j),$$

where all addition is over GF[2], and $$m_r^{C2V}(j) = F^{-1}\left(\left(\sum_{i=1}^{d} F(m_r^{V2C}(i))\right) - F(m_r^{V2C}(j))\right),$$

where we define F(x):=log coth (x/2). (In both of the above equations the superscript V2C denotes the incoming messages at the check node.) We note that F is its own inverse, i.e., $F^{-1}(x)=F(x)$.

Most message passing algorithms can be viewed as approximations to belief propagation. It will be appreciated that in any practical digital implementation messages will be comprised of a finite number of bits and the message update rules suitably adapted.

It should be apparent that the complexity associated with representing LDPC codes for large codewords is daunting, at least for hardware implementations trying to exploit parallelism. In addition, it can be difficult to implement message passing in a manner that can support processing at high speeds.

In order to make the use of LDPC codes more practical, there is a need for methods of representing LDPC codes corresponding to large codewords in an efficient and compact manner thereby reducing the amount of information required to represent the code, i.e., to describe the associated graph. In addition, there is a need for techniques which will allow the message passing associated with multiple nodes and multiple edges, e.g., four or more nodes or edges, to be performed in parallel in an easily controlled manner, thereby allowing even large codewords to be efficiently decoded in a reasonable amount of time. There is further need for a decoder architecture that is flexible enough to decode several different LDPC codes. This is because many applications require codes of different lengths and rates. Even more desirable is an architecture that allows the specification of the particular LDPC code to be programmable.

BRIEF DESCRIPTION OF THE FIGURES

FIG. 2 is a matrix representation of the code graphically illustrated in FIG. 1.

FIG. 5, which comprises the combination of

FIG. 6 is a graphical representation of a small LDPC code which is used as the basis of a much larger LDPC code to present an example in accordance with the present invention.

FIG. 7 illustrates the parity check matrix representation of the small LDPC code graphically illustrated in FIG. 6.

FIG. 8 illustrates how the edges in the code shown in FIG. 6 can be arranged, e.g., enumerated, in order from the variable node side and how the same edges would appear from the constraint node side.

FIG. 12 illustrates how the edges in the code shown in FIG. 11 can be arranged, e.g., enumerated, in order from the variable node side and how the same edges will appear from the constraint node side.

SUMMARY OF THE INVENTION

Figure 1:
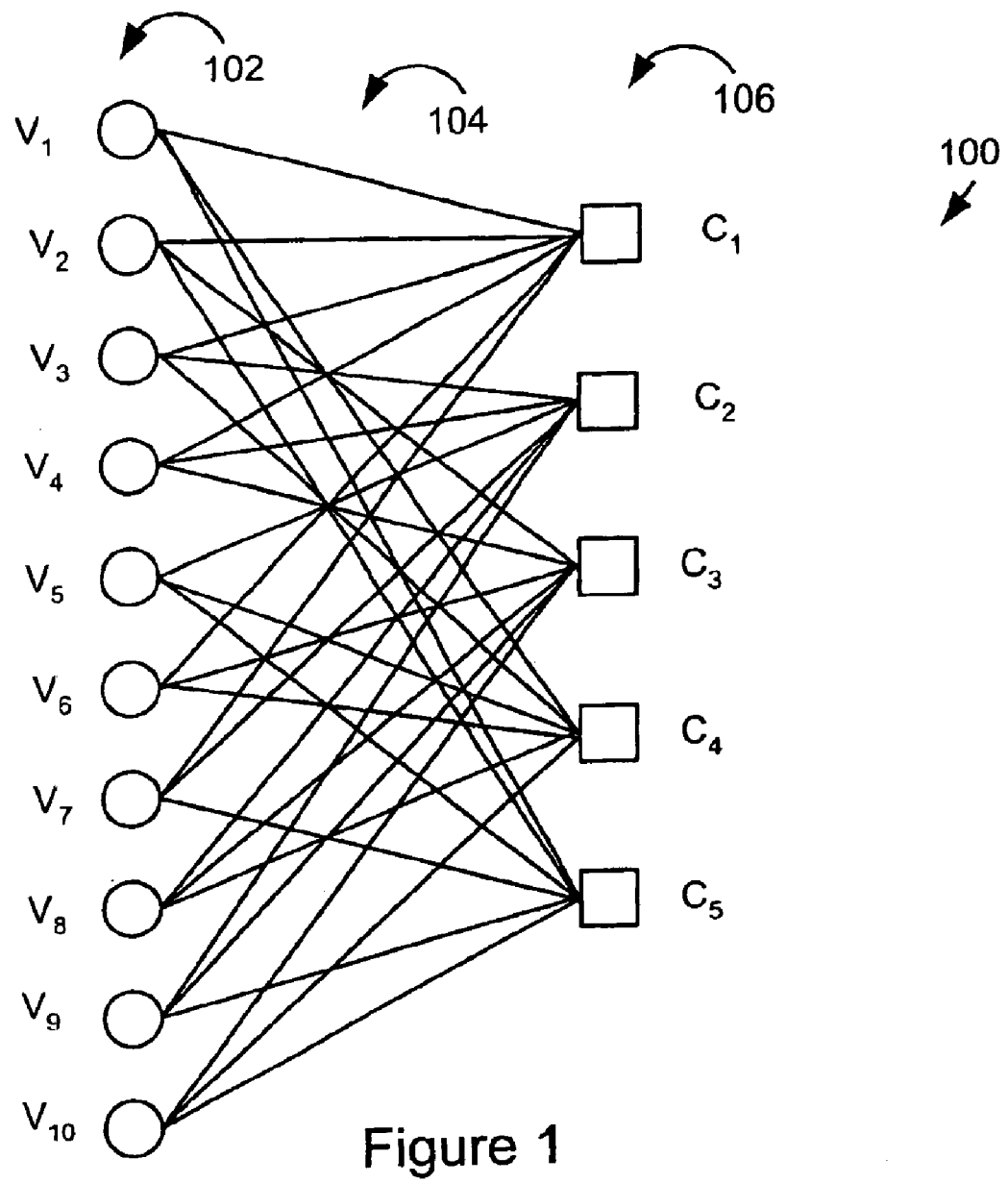
FIG. 1 illustrates a bipartite graph representation of an exemplary regular LDPC code of length ten.
Figure 3:
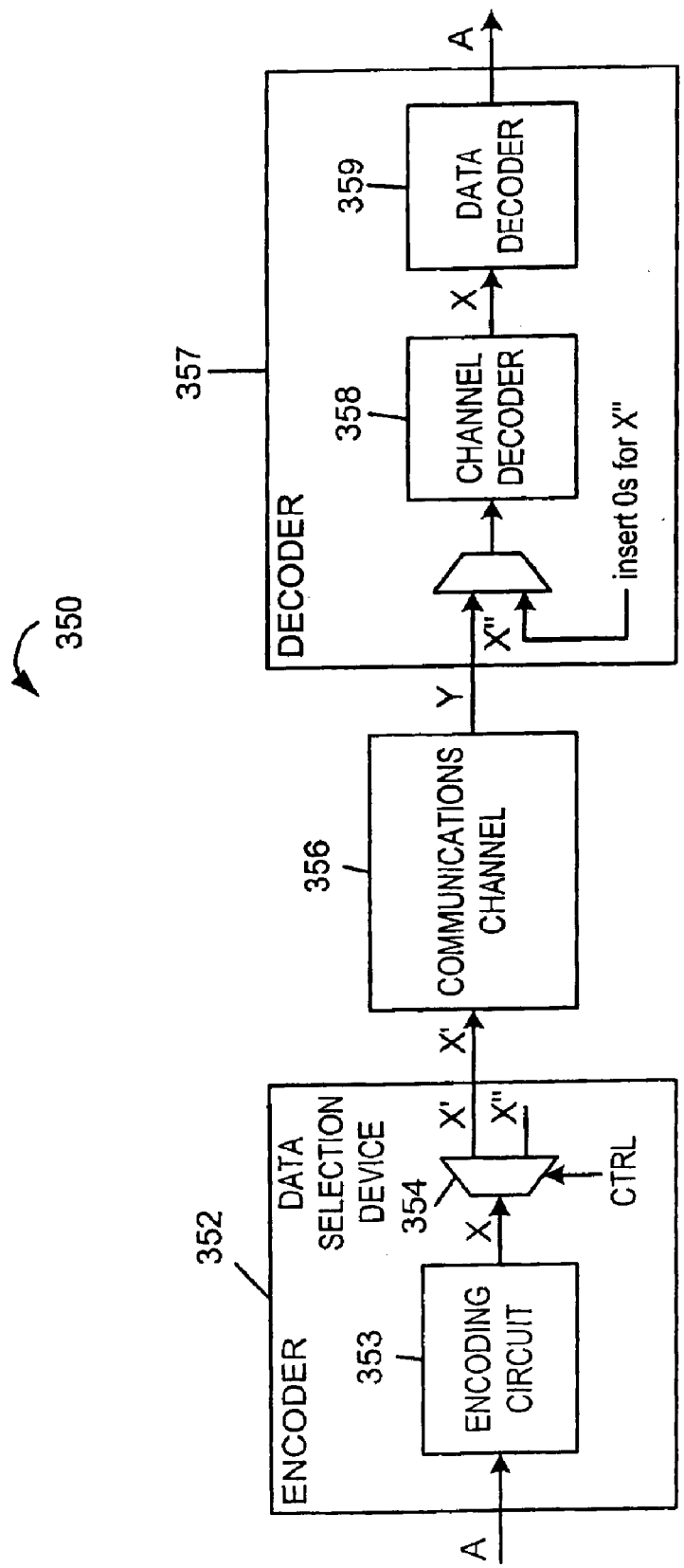
FIG. 3 illustrates coding, transmission, and decoding of data.

The present invention is directed to methods and apparatus for performing decoding operations on words using message passing decoding techniques. The techniques of the present invention are particularly well suited for use with large LDPC codes, e.g., codewords of lengths greater than 750 bits, but they can be used for shorter lengths also. The techniques and apparatus of the present invention can also be used for graph design and decoding where other types of message passing algorithms are used. For purposes of explaining the invention, however, exemplary LDPC decoders and decoding techniques will be described.

The techniques of the present invention allow for decoding of LDPC graphs that possess a certain hierarchal structure in which a full LDPC graph appears to be, in large part, made up of multiple copies, Z say, of a Z times smaller graph. The Z graph copies may be identical. To be precise we will refer to the smaller graph as the projected graph. The technique can be best appreciated by first considering a decoder that decodes Z identical small LDPC graphs synchronously and in parallel. Consider a message passing decoder for a single small LDPC graph. The decoder implements a sequence of operations corresponding to a message passing algorithm. Consider now augmenting the same decoder so that it decodes Z identical such LDPC graphs synchronously and in parallel. Each operation in the message passing algorithm is replicated Z times. Note that the efficiency of the decoding process is improved because, in total, decoding proceeds Z times faster and because the control mechanisms required to control the message passing process need not be replicated for the Z copies but can rather be shared by the Z copies. We can also view the above Z-parallel decoder as a vector decoder. We can view the process of making Z copies of the smaller graph as vectorizing the smaller (projected) graph: Each node of the smaller graph becomes a vector node, comprising Z nodes, each edge of the smaller graph becomes a vector edge, consisting of Z edges, each message exchanged in decoding the smaller graph becomes a vector message, comprising Z messages.

The present invention obtains the efficiencies of the above described vectorization while modifying it so that the vector decoder is in fact decoding one large graph, Z times larger than the projected graph. This is accomplished by interconnecting the Z copies of the projected graph in a controlled manner. Specifically, we allow the Z edges within a vector edge to undergo a permutation, or exchange, between copies of the projected graph as they go, e.g., from the variable node side to the constraint node side. In the vectorized message passing process corresponding to the Z parallel projected graphs this exchange is implemented by permuting messages within a vector message as it is passed from one side of the vectorized graph to the other.

Consider indexing the projected LDPC graphs by 1,j, . . . ,Z. In the strictly parallel decoder variable nodes in graph j are connected only to constraint nodes in graph j. In accordance with the present invention, we take one vector edge, including one corresponding edge each from each graph copy, and allow a permutation within the Z edges, e.g., we permit the constraint sockets corresponding to the edges within the vector edge to be permuted, e.g., re-ordered. Henceforth we will often refer to the permutations, e.g., re-orderings, within the vector edges as rotations.

Thus, in accordance with the present invention, a relatively large graph can be represented, e.g., described, using relatively little memory. For example, a graph may be represented by storing information describing the projected graph and information describing the rotations. Alternatively, the description of the graph may be embodied as a circuit that implements a function describing the graph connectivity.

Accordingly, the graph representation technique of the present invention facilitates parallel, ee.g., vectorized, graph implementations. Furthermore, the graph representation techniques of the present invention can be used to support decoding of regular or irregular graphs, with or without state variables. Information describing the degrees of the nodes in the projected graph may be stored and provided to a vector node processing element. Note that all nodes belonging to a vector node will have the same degree so degree information is required only for one projected graph.

In various embodiments, the decoder is made programmable thereby allowing it to be programmed with multiple graph descriptions, e.g., as expressed in terms of stored projected graph and stored rotation information or in terms of an implemented function. Accordingly, the decoders of the present invention can be programmed to decode a large number of different codes, e.g., both regular and irregular. In some particular embodiments the decoder is used for a fixed graph or for fixed degrees and this information. In such embodiments the graph description information may be preprogrammed or implicit. In such cases the decoder may be less flexible than the programmable embodiments but the resources required to support programmability are saved.

In accordance with one embodiment of the present invention, a message memory is provided which includes rows of memory locations, each row corresponding to the messages associated with one copy of the projected graph. The messages corresponding to the Z multiple projected graphs are stacked to form columns of Z messages per column, such a column corresponds to a vector message. This memory arrangement allows the vector messages, e.g., set of Z messages, corresponding to vector edge to be read out of or written to memory as a unit, e.g., using a SIMD instruction to access all the Z messages in a column in one operation. Thus, memory supports reading and writing of vector messages as units. Accordingly, the present invention avoids the need to provide a different read/write address for each individual message in a set of Z messages.

At one or more points in the message passing processing, after being read out of memory, the Z messages are subject to a permutation operation, e.g., a re-ordering operation. The re-ordering operation may be a rotation operation, or rotation for short. These rotation operations correspond to the rotations associated to the vector edges which interconnect the Z copies of the projected graph to form the single large graph. This rotation may be applied, e.g., prior to the messages being supplied to a corresponding vector (constraint or variable) node processor. Alternatively the rotation may be applied subsequent to processing by a vector node processor.

The rotation may be implemented using a simple switching device which connects, e.g., the message memory to the vector node processing unit and re-orders those messages as they pass from the memory to the vector node processing unit. In such an exemplary embodiment, one of the messages in each vector message read from memory is supplied to a corresponding one of the Z parallel node processing units, within a vector node processor, as determined by the rotation applied to the vector message by the switching device. A rotation operation as implemented by the switching device may also or alternatively be applied to the vector message prior to its being written into memory and after node processing.

The stored or computed description of the projected graph may include, e.g., information on the order in which messages in a row corresponding to a projected graph are to be read out of and/or written in to memory during constraint and/or variable node processing. The messages of the entire large graph are stored in multiple rows, each row corresponding to a different copy of the small graph, the rows being arranged to form columns of messages. Each column of messages represents a vector message, which can be accessed as a single unit. Thus, the information on how to access messages in a row of a projected graph can be used to determine the order in which vector messages corresponding to multiple copies of the projected graph are accessed in accordance with the present invention.

The varying of the order in which vector messages are read out and/or written to memory according to whether the read/write operation corresponds to variable node side or constraint node side processing may be described as a first permutation performed on the messages. This permutation corresponds to the interleaver associated to the projected graph. In order to represent the large decoder graph from the projected decoder graph, a second set of permutation information, e.g., the rotation information, is stored in addition to vector message (e.g., column) access order information. The second permutation information (e.g., the rotation information), representing switching control information, indicates how messages in each vector message, e.g., column of messages, should be reordered when, e.g., read out of and/or written in to memory. This two-stage permutation factors the larger permutation describing the complete LDPC graph into two parts implemented via different mechanisms.

In one particular embodiment, a cyclic permutation is used as the second level permutation because of the ease with which such a permutation can be implemented and the compactness of its description. This case motivates the use of the term rotation to describe this second level permutation for purposes of explanation. However, it is to be understood that the second level permutation need not be limited to rotations and can be implemented using other re-ordering schemes.

In various embodiments of the present invention, the decoder generates multi-bit soft outputs with one bit, e.g., the sign or parity bit of each soft output, corresponding to a hard decision output of the decoder, e.g., the original codeword in the case where all errors have been corrected or no errors are present in the received word. The decoder output, e.g., the recovered codeword, may then be processed further to recover the original data which was used at encoding time to produce the transmitted codeword.

In accordance with one feature of the present invention, soft and/or hard outputs produced after each complete iteration of variable node processing are examined to determine if the parity check constraints indicative of a codeword are satisfied by the current hard decisions. This checking process also enjoys the benefits of the graph's two stage factored permutation structure. The iterative decoding process (message passing) may be halted once recovery of a codeword is detected in this manner. Accordingly, in the case of relatively error free signals, decoding may be completed and detected promptly, e.g., after two or three iterations of the message passing decoding process. However, in the case of received words that include more errors, numerous iterations of the decoding process may occur before decoding is successful or the process is halted due to a time out constraint.

Prompt detection of successful decoding, in accordance with the present invention, allows for more efficient use of resources as compared to systems that allocate a fixed number of decoding iterations to each received word.

Since the decoding techniques of the present invention allow for a large number of decoding operations, e.g., constraint and/or variable node decoder processing operations, to be performed in parallel, the decoders of the present invention can be used to decode received words at high speeds. Furthermore, given the novel technique of the present invention used to represent large graphs and/or controlling message passing for decoding operations associated with such graphs, the difficulties of storing the descriptions of large graphs and controlling their message routing are reduced and/or overcome.

Certain generalizations of LDPC codes and decoding techniques of the invention include coding/decoding over larger alphabets not simply bits, which have two possible values, but some larger number of possibilities. Codes where constraint nodes represent constraints other than parity check constraints may also be decoded using the methods and apparatus of the present invention. Other relevant generalizations to which the invention can be applied include situations where a message passing algorithm is to be implemented on a graph and one has the option to design the graph. It will be apparent to those skilled in the art, in view of the present patent application, how to apply the techniques of the present invention to these more general situations.

Numerous additional advantages, features and aspects of the decoding techniques and decoders of the present invention will be apparent from the detailed description which follows.

DETAILED DESCRIPTION OF THE INVENTION

As discussed above, the decoding methods and apparatus of the present invention will be described for purposes of explanation in the context of an LDPC decoder embodiment. Steps involved in decoding of an LDPC code will first be described with reference to FIGS. 4 and 5 followed by a more detailed discussion of various features of the present invention.

Figure 4:
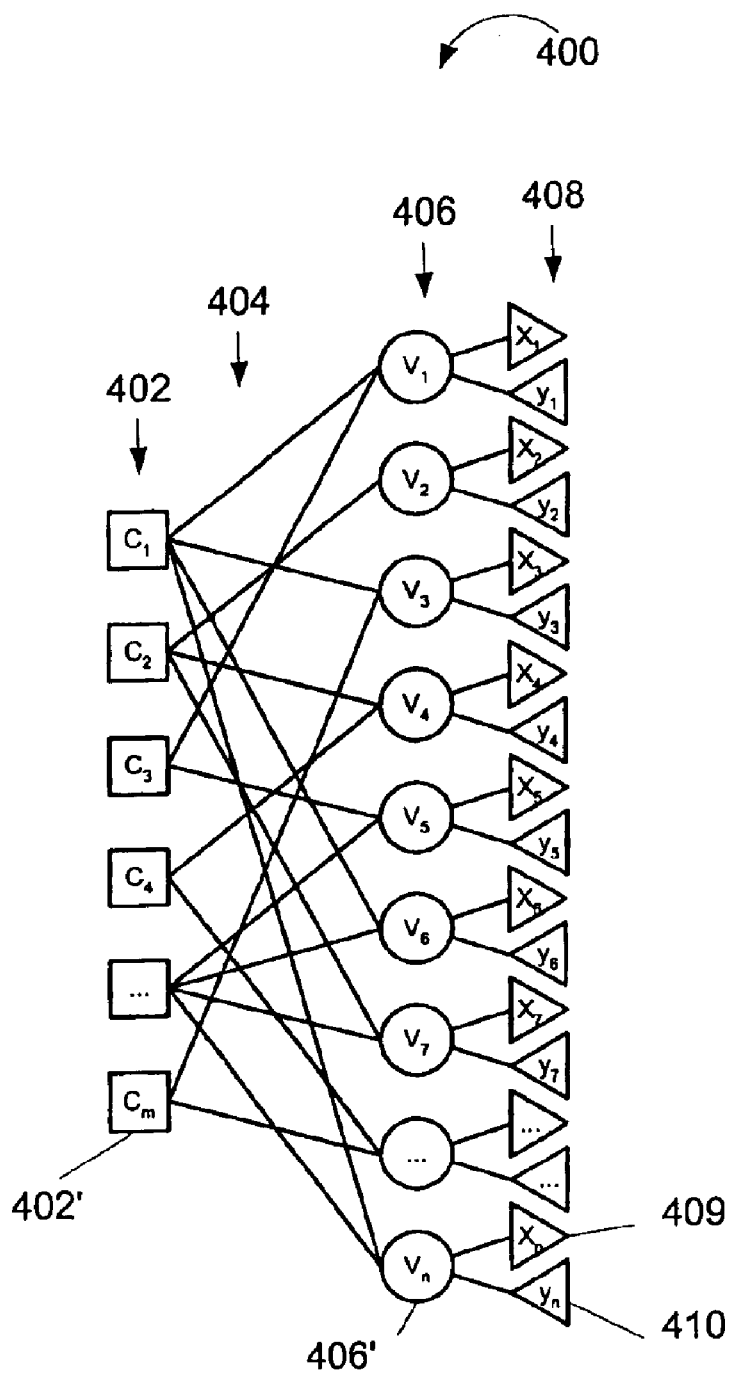
FIG. 4 is a bipartite graph representation of an exemplary irregular LDPC code.

FIG. 4 illustrates an exemplary irregular LDPC code using a bipartite graph 400. The graph includes m check nodes 402, n variable nodes 406, and a plurality of edges 404. Messages between the check nodes and variable nodes are exchanged over the edges 404. Soft input bits $y_1$ through $y_n$, corresponding to the received word Y, and soft (or hard) outputs $x_1$ through $x_n$ are indicted by reference numeral 408. The $m^{th}$ check node is identified using reference numeral 402'; the $n^{th}$ variable node is identified using reference numeral 406' while the $n^{th}$ soft input $y_n$ and the nth soft output $x_n$ are indicated in FIG. 4 using reference numbers 410, 409 respectively.

Variable nodes 406 process messages from the constraint nodes 402 together with the input soft values from the received word $y_1, \ldots, y_n$ to update the value of the output variables $x_1, \ldots, x_n$ corresponding to the variable nodes and to generate messages to the constraint nodes. One message is generated by a variable node for each edge connected to the variable node. The generated message is transmitted along the edge from the variable node to the constraint node attached to the edge. For purposes of explanation, messages from variable nodes to constraint nodes will, from time to time in the present application, be indicated by using the abbreviation V2C while messages from variable nodes to constraint nodes will be indicated by using the abbreviation C2V. Indices may be added to the V and C components of this abbreviation to indicate the particular one of the variable nodes and constraint nodes which serves as the source/destination of a particular message. Each constraint node 402 is responsible for processing the messages received from the variable nodes via the edges attached to the particular constraint node. The V2C messages received from the variable nodes are processed by the constraint nodes 402 to generate C2V messages which are then transmitted back along the edges attached to each constraint node. The variable nodes 406 then process the C2V messages, together with the soft input values, to generate and transmit new V2C messages, and generate soft outputs, $x_i$. The sequence of performing processing at the variable nodes 406 comprising: transmitting generated messages to the check nodes 402, generating at the variable nodes soft outputs $x_i$, and receiving messages from the check nodes, may be performed repeatedly, i.e., iteratively, until the outputs $x_i$ from the variable nodes 406 indicate that the codeword has been successfully decoded or some other stopping criterion, e.g., completion of a fixed number of message passing iterations, has been satisfied. It should be appreciated that the sequence of operations described above need not occur strictly in the order described. Node processing may proceed asynchronously and variable and constraint node processing may occur simultaneously. Nevertheless, the logic of the iterative process is as described.

Messages, V2C and C2V, may be one or more bits, e.g., K bits each, where K is a positive non-zero integer value. Similarly the soft outputs $x_i$ may be one or multiple bits. Multiple bit messages and outputs provide the opportunity to relay confidence or reliability information in the message or output. In the case of a multi-bit, (soft) output, the sign of the soft output value may be used to provide the single bit hard output of the decoding process corresponding to a variable node, e.g., the bits of the decoded codeword. Output soft values may correspond to decoded soft values or, alternatively, to so-called extrinsic information (excluding the corresponding input information) which may be used in another larger iterative process within which the LDPC decoder is but one module.

The iterative message passing process associated with decoding an LDPC code will now be discussed further with respect to FIGS. 5a through 5d.

When decoding an LDPC code, the processing at each constraint and variable node may be performed independently. Accordingly, variable and/or constraint node processing may be performed one node at time, e.g., in sequence, until some or all of the variable and constraint node processing has been completed for a particular iteration of the decoding process. This allows a single unit of processing hardware to be provided and reused, if desired, to perform the processing associated with each of the variable and/or constraint nodes. Another significant feature of LDPC decoding is that the V2C and C2V messages used during a particular processing iteration need not have been generated at the same time, e.g., during the same processing iteration. This allows for implementations where constraint and variable node processing can be performed in parallel without regard to when the utilized messages were last updated. Following a sufficient number of message updates and iterations wherein all the variable and constraint nodes process the received messages and generate updated messages, the (hard) output of the variable nodes will converge assuming that the graph was properly designed and there are no remaining uncorrected errors in the received word being processed.

Given that the processing at each check node and variable node can be viewed as an independent operation, the iterative processing performed at a single exemplary check node $C_n$ 502' and variable node $V_n$ 506' will now be discussed in more detail with reference to FIGS. 5a–5d. For purposes of description we will think of message values and soft input and output values as numbers. A positive number corresponds to a hard bit decision of 0 and a negative number corresponds to a hard bit decision of 1. Larger magnitudes indicate larger reliability. Thus, the number zero indicates total unreliability and the sign (positive or negative) is irrelevant. This convention is consistent with standard practice in which soft values (messages, received and output values) represent log-likelihoods of the associated bits, i.e., soft values take the form $$\log\frac{\text{probability bit is a 0}}{\text{probability bit is a 1}}$$

where the probability is conditioned on some random variable, e.g., the physical observation of the bit from the communications channel in the case of a received value.

Figure 5A:
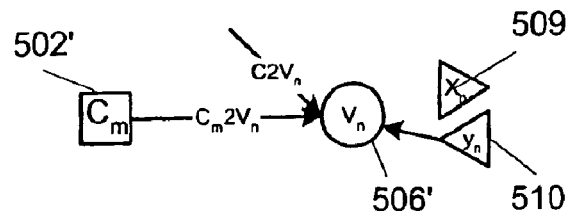
FIGS. 5a through 5d, illustrates steps performed as part of an LDPC decoding operation in accordance with the LDPC code illustrated in FIG. 4.

FIG. 5a illustrates the initial step in an LDPC decoding process. Initially, the variable node $V_n$ 506' is supplied with the soft input, e.g., the received values (1 or more bits) $y_n$ from a received word to be processed. The C2V messages at the start of a decoding operation and the soft output $X_n$ 509 are initially set to zero. Based on the received inputs, e.g., the zero value C2V messages and input $y_n$, the variable node $V_n$ 506' generates one V2C message for each check node to which it is connected. Typically, in the initial step, each of these messages will be equal to $y_n$.

Figure 5B:
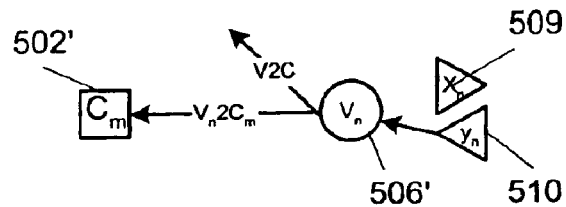
Figure 5C:
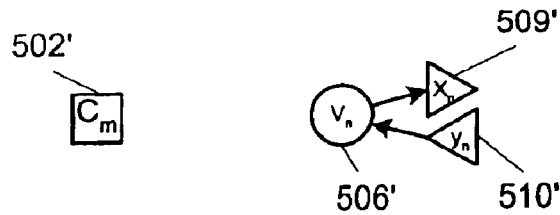

In FIG. 5b generated V2C messages are shown being transmitted along each of the edges connected to variable node $V_n$ 506'. Thus, updated V2C messages are transmitted to each of the check nodes 502 coupled to variable node $V_n$ 506' including check node $C_m$ 502'.

In addition to generating the V2C messages, variable node processing results in the updating of the soft output $X_n$ 509' corresponding to the variable node doing the processing. The soft output $X_n$ is shown being updated in FIG. 5c. While shown as different steps, the soft output may be output at the same time the V2C messages are output.

As will be discussed further below, in accordance with some embodiments of the present invention, the soft outputs (or their associated hard decisions) may be used to determine when a codeword has been recovered from the received word, i.e., when the parity constraints have been satisfied by the output values. This indicates successful decoding (although the codeword found may be incorrect, i.e., not the one that was transmitted) thereby allowing the iterative decoding process to be halted in a timely fashion, e.g., before some fixed maximum allowed number of message passing iterations is completed.

Check node processing can be performed once a check node, e.g., check node $C_m$ 502', receives V2C messages along the edges to which it is connected. The received V2C messages are processed in the check node to generate updated C2V messages, one for each edge connected to the particular check node. As a result of check node processing, the C2V message transmitted back to a variable node along an edge will depend on the value of each of the V2C messages received on the other edges connected to the check node but (usually and preferably but not necessarily) not upon the V2C message received from the particular variable node to which the C2V message is being transmitted. Thus, C2V messages are used to transmit information generated from messages received from variable nodes other than the node to which the message is being transmitted.

Figure 5D:
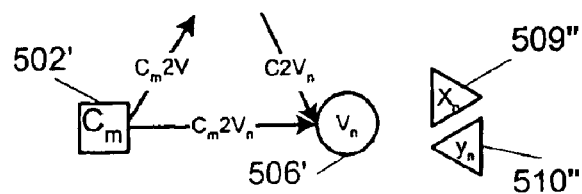

FIG. 5d illustrates the passage of updated C2V messages to variable nodes including node 506'. In particular, in FIG. 5d constraint node $C_m$ 502' is shown outputting two updated C2V messages with the updated $C_m2V_n$ message being supplied to variable node $V_n$ 506'. $V_n$ 506' also receives additional updated $C2V_n$ message(s) from another constraint node(s) to which it is connected.

With the receipt of updated C2V messages, variable node processing can be repeated to generate updated V2C messages and soft outputs. Then the updating of C2V messages can be repeated and so on until the decoder stopping criterion is satisfied.

Thus, the processing shown in FIGS. 5a–5d will be repeated after the first iteration, using updated message values as opposed to initial values, until the decoding process is stopped.

The iterative nature of the LDPC decoding process, and the fact that the processing at individual nodes can be performed independent of the processing at other nodes provides for a great deal of flexibility when implementing an LDPC decoder. However, as discussed above, the sheer complexity of the relationships between the edges and the nodes can make storage of edge relationship information, e.g., the graph description, difficult. Even more importantly, graph complexity can make message passing difficult to implement in parallel implementations where multiple messages are to be passed at the same time.

Practical LDPC decoder implementations often include an edge memory for storing messages passed along edges between constraint and/or variable nodes. In addition they include a graph descriptor sometimes referred to as a permutation map which includes information specifying edge connections, or socket pairing, thereby defining the decoding graph. This permutation map may be implemented as stored data or as circuit which calculates or implies the permutation. In addition to the edge memory, one or more node processing units are needed to perform the actual processing associated with a node.

Software LDPC decoder implementations are possible wherein software is used to control a CPU to operate as a vector processing unit and to control passing of messages using a memory coupled to the CPU. In software implementations, a single memory can also be used to store the decoder graph description, edge messages as well as decoder routines used to control the CPU.

As will be discussed below, in various embodiments of the present invention, one or more edge memories may be used. In one exemplary multiple edge memory embodiment a first edge memory is used for the storage and passing of C2V messages and a second edge memory is used for the storage and passing of V2C messages. In such embodiments, multiple node processing units, e.g., one to perform constraint node processing and another to perform variable node processing may, and often are, employed. As will be discussed below, such embodiments allow for variable and constraint processing operations to be performed in parallel with the resulting messages being written into each of the two message memories for use during the next iteration of the decoding process.

We will now present a simple example of a small LDPC graph and its representation which will be used subsequently in explaining the invention. The discussion of the LDPC graph will be followed by a description of an LDPC decoder which can be used to decode the small graph.

FIG. 6 illustrates a simple irregular LDPC code in the form of a graph 600. The code is of length five as indicated by the 5 variable nodes $V_1$ through $V_5$ 602. Four check nodes $C_1$ through $C_4$ 606 are coupled to the variable nodes 602 by a total of 12 edges 604 over which messages may be passed.

FIG. 7 illustrates, using matrices 702, 704, the LDPC code shown in FIG. 6, in parity check matrix form. As discussed above, edges are represented in the permutation matrix H 702 using 1's. Bit $x_i$ is associated to variable node $V_i$. Matrices 706 and 708 show the 1's in H, corresponding to edges in the graph, indexed according to the variable socket order and constraint socket order, respectively.

For purposes of explanation, the 12 edges will be enumerated from the variable node side, i.e., according to their variable sockets. The connections established by the edges between the variable nodes 602 and check nodes 606 can be seen in FIG. 6. For purposes of discussion the edges attached to variable $V_1$ which connects it to check nodes $C_1$, $C_2$ and $C_3$, are assigned labels 1, 2, 3, corresponding to variable socket enumeration. Variable node $V_2$ is connected to check nodes $C_1$, $C_3$ and $C_4$ by edges 4, 5 and 6, respectively. Variable node $V_3$ is coupled to check nodes $C_1$ and $C_4$ by edges 7 and 8, respectively. In addition, variable node $V_4$ is coupled to check nodes $C_2$ and $C_4$ by edges 9 and 10, respectively, while variable node $V_5$ is coupled to check nodes $C_2$ and $C_3$ by edges 11 and 12, respectively. This indexing corresponds with matrix 706 of FIG. 7, i.e., variable socket order.

FIG. 8 illustrates the relationship between the 12 edges of FIG. 6, as enumerated from the variable node side, in relationship to the variable and check nodes to which they are connected. Row 802 shows the 5 variable nodes $V_1$ through $V_5$. Beneath the variables 802 are shown the edges 1 through 12 804 corresponding to the associated sockets which are connected to the particular variable node. Note that since the edges are ordered from the variable node side, in row 804 they appear in order from 1–12. Let us assume that messages are stored in memory in the order indicated in row 804.

During variable node processing, the 12 edge messages in memory are accessed in sequence, e.g., in the order shown in 804. Thus, during variable node processing, the messages may simply be read out in order and supplied to a processing unit.

Row 806 illustrates the four constraint nodes C1 through C4 present in the code of FIGS. 6 and 7. Note that the edges are re-ordered in row 804' to reflect the order in which they are connected to the constraint nodes, but the indicated indexing is that induced from the variable node side. Accordingly, assuming that the edge messages are stored in order from the variable node side, when performing constraint node processing the messages would be read out in the order illustrated in row 804'. That is, during constraint node processing the messages would be read out of the memory in the order 1, 4, 7, 2, 9, 11, 3, 5, 12, 6, 8, 10. A message ordering module can be used to output the correct sequence of edge message access information, e.g., memory locations, for reading data from memory or writing data to memory during variable and check node processing operations.

A serial LDPC decoder 900 which performs message processing operations sequentially, one edge at a time, will now be discussed with regard to FIG. 9 and decoding using the exemplary code shown in FIG. 6 will be discussed. The LDPC decoder 900 comprises a decoder control module 902, a message ordering module (socket permutation memory) 904, a node degree memory 910, an edge memory 906, a node processor 908, output buffer 916, hard decision memory 912 and parity check verifier 914.

The edge memory 906 includes L K bit memory locations with each K bit location corresponding to one edge and where L is the total number of edges in the LDPC graph being used and K is the number of bits per message exchanged along an edge. For concreteness, we assume that the messages are stored in order according to the edge ordering induced by the variable sockets. Thus, for the example graph 600 the messages corresponding to edges 1,2, . . . ,12 are stored in the indicated order. The hard decision memory 912 includes L 1 bit memory locations, each 1 bit location corresponding to one edge. This memory stores hard decisions transmitted by the variable nodes along each of their edges so that the parity check constraints may be verified. The parity check verifier 914 receives the hard bit decisions as the check node processor receives messages. The parity checks are verified in the parity check verifier and, in the event that all checks are satisfied, transmits a convergence signal to the decoder control module 902.

The message ordering module 904 may be implemented as a permutation map or look-up table which includes information describing the ordering of messages in edge memory as viewed from the variable node side or as viewed from the constraint node side. Thus, for our example graph 600 the sequence 1,4,7,2,9,11,3,5,12,6,8,10 which specifies edge order as viewed from the constraint side would be, effectively, stored in the message ordering module. This sequence is used to order messages for constraint node processing and to order hard decisions read out of Hard Decision Memory 912 for processing by the parity check verifier 914.

Figure 9:
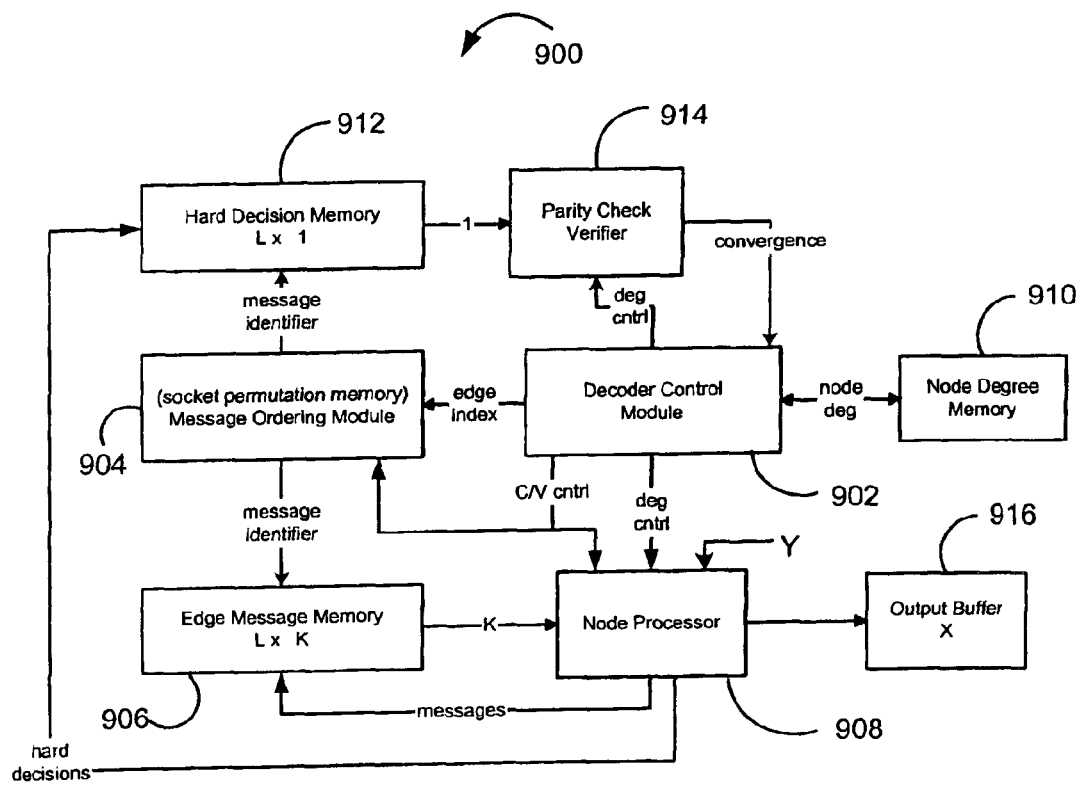
FIG. 9 illustrates a system for performing a serial LDPC decoding operation.

In the FIG. 9 decoder, messages corresponding to an edge are overwritten after they are processed by a node processor. In this manner, the edge memory will alternate between storing V2C messages and storing C2V messages. Hard decision verification occurs during constraint node processing, e.g., as V2C messages are read out of edge message memory 906.

The decoder control unit 902 is responsible for toggling the decoder operation between variable and check node processing modes of operation, for determining when the iterative decoding process should be stopped, e.g., because of receipt of a convergence signal or reaching a maximum allowed iteration count, for supplying or controlling the supply of degree information to the node processing unit and the parity check verifier, and for controlling the supply of an edge index to the Message Ordering Module 904. During operation, the decoder control module 902 transmits an edge index to the message ordering module 904. The value, edge index, is incremented over time to sequence through all the edges in the graph. A different, e.g., unique, edge index is used for each edge in a graph being implemented. In response to each received edge index, the message ordering module will output an edge identifier, e.g., edge memory address information, thus selecting the edge memory location that will be accessed, e.g., read from or written to, at any given time. Assuming variable socket ordering, the message ordering module 904 will cause messages to be read out and written back in sequential order during variable node processing and will cause the messages to be read out and written back in order corresponding to constraint socket ordering during constraint node processing. Thus, in our above example, the messages will be read out and written back in order 1,2,3, . . . ,12 during variable node processing and, concurrently, hard decisions will be written into hard decision memory 912 in order 1,2,3, . . . ,12. During constraint node processing the messages will be read out and written back in order 1,4,7,2,9,11,3,5,12,6,8,10 and, concurrently, the message ordering module 904 will cause hard decision bits to be read out of hard decision memory 912 in the order 1,4,7,2,9,11,3,5,12,6,8,10.

As messages are read from the edge memory in response to the edge identifier received from the Message Passing Control module 904, they are supplied to the node processor 908. The node processor 908 performs the appropriate constraint or variable node processing operation, depending on the mode of operation, thereby using the received messages to generate updated messages corresponding to the particular node being implemented at any given time. The resulting updated messages are then written back into the edge memory overwriting the messages which were just read from the memory. Messages sent to a particular node arrive at the node processor as a contiguous block, i.e., one after another. The decoder control module 902 signals node delineation to the node processor, e.g., by indicating the last message corresponding to a node thereby providing node degree information. In the case of the example graph 600, the variable node degrees would be specified, e.g., as the sequence (3,3,2,2,2) and the constraint node degrees would be specified, e.g., as the sequence (3,3,3,3). This information may be stored in node degree memory 910 which would then be read by the decoder control module 902 as it iterates over edge indices. Alternatively, the degree information may be preprogrammed into each of the node processing units. This can be preferable, e.g., when it is known in advance that the node degrees will be uniform, i.e., the graph will be regular.

The parity check verifier 914 operates in much the same fashion as a check node processor except that incoming messages are single bits, no outgoing message is computed, and the internal computation is simpler.

During variable node mode operation, variable node computations will be performed one node at a time by the node processing unit until the processing, e.g., message updating and soft output value generation operations associated with each of the variable nodes, has been completed. Messages are delivered to the node processor 908 in variable node side order so that all messages corresponding to one node arrive in sequence at the node processor 908. With an iteration of variable node processing completed, the decoder control module 902 causes the decoder 900 to switch into the constraint node mode of processing operation. In response to the change in the C/V control signal, the node processing unit 908 switches from a variable node processing mode into a constraint node processing mode. In addition the message ordering module 904 switches into a mode wherein message identifiers will be supplied to the edge memory in the constraint socket order. One or more control signals sent over the C/V control line can be used to control the switch between constraint and variable node processing modes of operation.

As the decoder control circuit 902 controls the decoder to perform constraint node processing in constraint node sequence, one node at a time, the messages stored in the edge memory will once again be updated, this time by the C2V messages generated by the constraint node processing. When the processing associated with the full set of constraint nodes has been completed, the decoder control circuit 902 will switch back to the variable node mode of processing operation. In this manner, the decoder 900 toggles between variable node and constraint node processing. As described, the processing is performed sequentially, one node at a time, until the decoder control circuit 902 determines that the decoding operation has been completed.

The scalar or sequential LDPC decoding system illustrated in FIG. 9 can be implemented using relatively little hardware. In addition it lends itself well to software implementation. Unfortunately, the sequential nature of the processing performed tends to result in a relatively slow decoder implementation. Accordingly, while the scalar architecture shown in FIG. 9 has some noteworthy attributes, it tends to be unsuitable for high bandwidth applications such as optical communications or data storage where high decoding speed and the use of large codewords is desired.

Before presenting decoders for decoding large vectorized LDPC graphs, we will discuss general concepts and techniques relating to graph vectorizing features of the present invention. The vectorizing discussion will be followed by a presentation of exemplary vectorized LDPC decoders which embody the present invention.

For purposes of gaining an understanding of vectorizing LDPC graphs consider a 'small' LDPC code with parity check matrix H. The small graph, in the context of a larger vectorized graph, will be referred to as the projected graph. Let $\Phi$ denote a subset of Z×Z permutation matrices. We assume that the inverses of the permutations in $\Phi$ are also in $\Phi$. Given the small, projected, graph we can form a Z-times larger LDPC graph by replacing each element of H with a Z×Z matrix. The 0 elements of H are replaced with the zero matrix, denoted 0. The 1 elements of H are each replaced with a matrix from $\Phi$. In this manner we 'lift' an LDPC graph to one Z times larger. The complexity of the representation comprises, roughly, the number of bits required to specify the permutation matrices, $|E_H| \log |\Phi|$ plus the complexity required to represent H, where $|E_H|$ denotes the number 1s in H and $|\Phi|$ denotes the number of distinct permutations in $\Phi$. E.g., if $\Phi$ is the space of cyclic permutations then $|\Phi|=Z$. In practice we might have, e.g., $Z \approx 16$ for $n \approx 1000$.

$$H = \begin{bmatrix} 1 & 0 & 1 & 1 & 1 & 0 & 0 \\ 1 & 1 & 1 & 0 & 0 & 1 & 0 \\ 1 & 1 & 0 & 1 & 0 & 0 & 1 \\ 0 & 1 & 0 & 0 & 1 & 1 & 1 \end{bmatrix} \quad H = \begin{bmatrix} \sigma_1 & 0 & \sigma_7 & \sigma_9 & \sigma_{11} & 0 & 0 \\ \sigma_2 & \sigma_4 & \sigma_8 & 0 & 0 & \sigma_{13} & 0 \\ \sigma_3 & \sigma_5 & 0 & \sigma_{10} & 0 & 0 & \sigma_{15} \\ 0 & \sigma_6 & 0 & 0 & \sigma_{12} & \sigma_{14} & \sigma_{16} \end{bmatrix}$$

Example: Lifting a small parity check matrix, the $\sigma_i$, i=1, . . . ,16 are elements of $\Phi$ shown here indexed in projected variable socket order.

The subset $\Phi$ can in general be chosen using various criteria. One of the main motivations for the above structure is to simplify hardware implementation of decoders. Therefore, it can be beneficial to restrict $\Phi$ to permutations that can be efficiently implemented in hardware, e.g., in a switching network.

Parallel switching network topologies is a well studied subject in connection with multiprocessor architectures and high speed communication switches. One practical example of a suitable architecture for the permutation subset Φ is a class of multi-layer switching networks including, e.g., omega (perfect shuffle)/delta networks, log shifter networks, etc. These networks offer reasonable implementation complexity and sufficient richness for the subset Φ. Additionally multi-layer switching networks scale well e.g., their complexity rises as N log N where N is the number of inputs to the network, which makes them especially suitable for massively parallel LDPC decoders. Alternatively, in decoders of the present invention with relatively low levels of parallelism and small Z the subset Φ of permutations can be implemented in a single layer.

An LDPC graph is said to have "multiple edges" if any pair of nodes is connected by more than one edge. A multiple edge is the set of edges connecting a pair of nodes that are connected by more than one edge. Although it is generally undesirable for an LDPC graph to have multiple edges, in many cases it may be necessary in the construction of vectorized graphs that the projected graph possesses multiple edges. One can extend the notion of a parity check matrix to allow the matrix entries to denote the number of edges connecting the associated pair of nodes. The codeword definition is still the same: the code is the set of 0,1 vectors x satisfying Hx=0 modulo 2. When vectorizing a projected graph with multiple edges, in accordance with the invention, each edge within the multiple edge is replaced with a permutation matrix from Φ and these matrixes are added to yield the extended parity check matrix of the full code. Thus, a j>1 in the parity check matrix H of the projected graph will be 'lifted' to a Sum $\sigma_k + \sigma_{k+1+} \cdots + \sigma_{k+j-1}$, of permutation matrixes from Φ. Usually, one will choose the elements of the sum so that each entry of $\sigma_k + \sigma_{k+1+} \cdots + \sigma_{k+j-1}$ is either 0 or 1, i.e., the full graph has no multiple edges.

The above described lifting appears to have one limitation. Under the above construction both the code length and the length of the encoded data unit must be multiples of Z. This apparent limitation is easily overcome, however. Suppose the data unit to be encoded has length A Z+B where A is a positive integer and B is between 1 and Z inclusive, and the desired code length is C Z+D where C is a positive integer and D is between 0 and Z-1 inclusive. Let E be the smallest positive integer such that E Z>=C Z+D+(Z-B). One can design a lifted graph which encodes a (A+1)Z length data unit to produce a codeword of length E Z such that the data unit appears as part of the codeword, and use this to produce the desired code parameters as follows. Given a data unit of length AZ+B one concatenates Z-B zeros to produce a data unit of length (A+1)Z. That data unit is encoded to produce a codeword of length EZ. The Z-B zeros are not transmitted. Out of the other EZ-(Z-B) bits in the codeword one selects EZ-CZ-D-(Z-B) bits and punctures them, note that the number of puncture bits is between 0 and Z-1 inclusive. These bits will not be transmitted, so the actual number of transmitted bits is EZ-(Z-B)-(EZ-CZ-D-(Z-B))=CZ+D, which is the desired code length. The receiver, knowing in advance about the additional zeros and punctured bits substitutes soft bits for the punctured bits indicating erasure, and substitutes soft bits for the known zero bits indicating a zero value with largest possible reliability. The extended received word, of length EZ may now be decoded to recover the original data unit. In practice one usually makes these adjustments by puncturing bits from only one vector node and declaring known bits from only one vector node.

Various decoder implications which use the above discussed technique of vectorizing LDPC graphs will now be addressed.

As discussed above, message-passing decoding of LDPC codes involves passing messages along the edges of the graph representing the code and performing computations based on those messages at the nodes of the graph, e.g., the variable and constraint nodes.

Given a vectorized LDPC graphs one can vectorize the decoding process as follows. The decoder operates as if it were decoding Z copies of the projected LDPC code synchronously and in parallel. Control of the decoding process corresponds to the projected LDPC graph and may be shared across the Z copies. Thus, we describe the decoder as operating on vector messages traversing vector edges and being received by vector nodes, each vector having Z elements. Sockets also become vectorized. In particular a vector node processor might comprise Z node processors in parallel and, when a vector of messages, $(m_1, \ldots, m_z)$ is delivered to the vector node processor message $m_i$ is delivered to the ith processor. Thus, no routing or reordering of messages occurs within a vector node processor, i.e., the vector message is aligned with the vector of processors in a fixed way.

One deviation from purely disjoint parallel execution of the Z projected graphs is that messages are re-ordered within a vector message during the message passing process. We refer to this re-ordering operation as a rotation. The rotation implements the permutation operations defined by T. Because of the rotations, the processing paths of the Z copies of the projected graph mix thereby linking them to form a single large graph. Control information which specifies the rotations is needed in addition to the control information required for the projected graph. Fortunately, the rotation control information can be specified using relatively little memory.

While various permutations can be used for the rotations in accordance with the present invention, the use of cyclic permutations is particularly interesting because of the ease with which such permutations can be implemented. For simplicity we will now assume that Φ comprises the group of cyclic permutations. In this case, our large LDPC graphs are constrained to have a quasi-cyclic structure. For purposes of this example, let N be the number of variable nodes in the graph and let M be the number of constraint nodes in the graph. First, we assume that both N and M are multiples of Z, N=nZ and M=mZ where Z will denote the order of the cycle.

Let us view nodes are doubly indexed. Thus, variable node $v_{i,j}$ is the $j^{th}$ variable node from the $i^{th}$ copy of the projected graph. Since Φ is the group of cyclic permutations variable node $v_{i,j}$ is connected to a constraint node $c_{a,b}$ if and only if variable node $V_{i+k \bmod Z, j}$ is connected to a constraint node $C_{a+k \bmod Z, b}$ for k=1, . . . ,Z.

The techniques of the present invention for representing a large graph using a much smaller graph representation and rotation information will now be explained further in reference to FIGS. 10 through 16 which relate to vectorization of the graph 600. The techniques described with reference to these figures can be applied to much larger LDPC graphs.

In accordance with the present invention, a larger graph can be generated by replicating, i.e., implementing multiple copies, of the small graph shown in FIG. 6 and then performing rotation operations to interconnect the various copies of the replicated graph. We refer to the small graph within the larger graph structure as the projected graph.

Figures 10, 11:
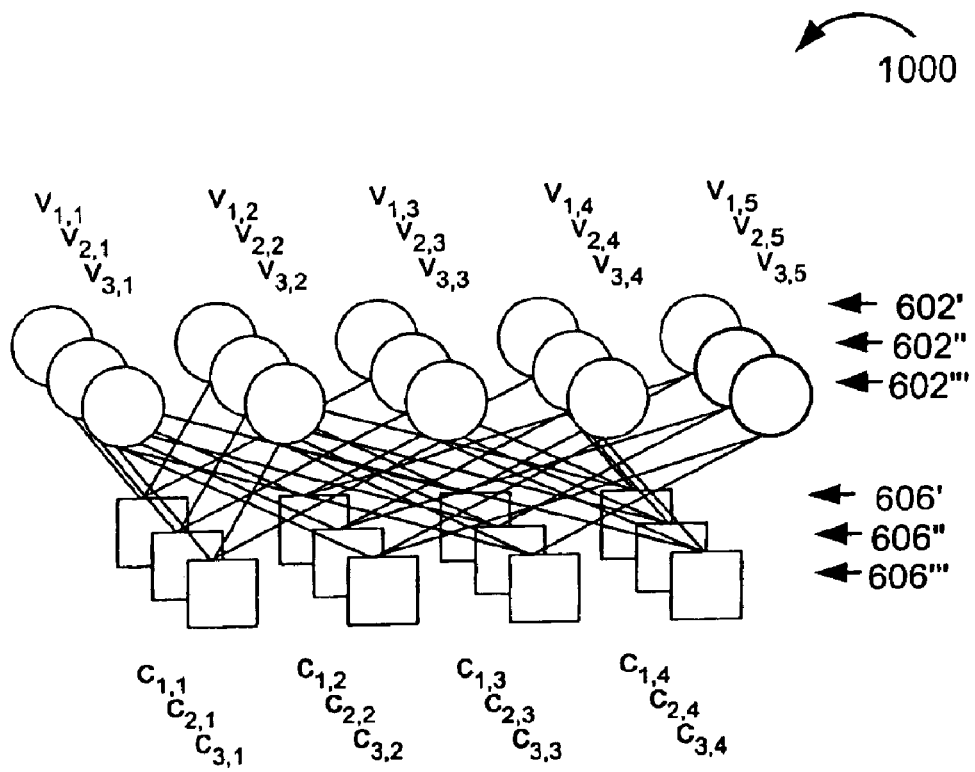
FIG. 10 graphically illustrates the effect of making three copies of the small LDPC graph shown in FIG. 6.
FIG. 11 illustrates the parity check matrix representation of the LDPC graph illustrated in FIG. 10.

FIG. 10 is a graph 1000 illustrating the result of making 3 parallel copies of the small graph illustrated in FIG. 6. Variable nodes 602', 602" and 602'" correspond to the first through third graphs, respectively, resulting from making three copies of the FIG. 6 graph. In addition, check nodes 606', 606" and 606'" correspond to the first through third graphs, respectively, resulting from making the three copies. Note that there are no edges connecting nodes of one of the three graphs to nodes of another one of the three graphs. Accordingly, this copying process, which "lifts" the basic graph by a factor of 3, results in three disjoint identical graphs.

FIG. 11 illustrates the result of the copying process discussed above using matrices 1102 and 1104. Note that to make three copies of the original graph each non-zero element in the matrix 702 is replaced with a 3×3 identity matrix. Thus, each one in the matrix 702 is replaced with a 3×3 matrix having 1's along the diagonal and 0's everywhere else to produce the matrix 1102. Note that matrix 1102 has 3 times the number of edges that matrix 702 had, 12 edges for each one of the 3 copies of the basic graph shown in FIG. 6. Here, variable $x_{ij}$ corresponds to variable node $V_{ij}$.

FIG. 12 shows the relationship between the (3×12) 36 edges, the (3×5) 15 variable nodes, and the (3×4) 12 constraint nodes which makeup graph 1000. As in the case of FIG. 8, edges are enumerated from the variable node side.

For purposes of annotation, the first number used to identify a node, constraint, or edge indicates the graph copy to which the edge belongs, e.g., the first, second or third graph copy. The second number is used to identify the element number within the particular specified copy of the basic graph.

For example, in row 1202' the value (1,2) is used to indicate edge 2 of the first copy of the graph while in row 1202" (2,2) is used to indicate edge 2 of the second copy of the graph.

Note that edge rows 1202', 1202", 1202'" are simply copies of row 804 representing three copies of the row of edges 804, shown in FIG. 8, as they relate to the variable nodes. Similarly edge rows 1204', 1204" and 1204'" represent three copies of the row of edges 804' shown in FIG. 8 as they relate to the constraint nodes.

Let us briefly discuss how to modify the FIG. 9 decoder 900 to decode the Z=3 parallel graphs now defined. The node processor 908 will be made a vector node processor, able to process 3 identical nodes simultaneously in parallel. All outputs from the node processor 908 will be vectorized, thereby carrying 3 times the data previously carried. Hard decision memory 912 and edge message memory 906 will be made 3 times wider, each capable of writing or reading 3 units (bits or K bit messages respectively) in parallel using at the direction of a single SIMD instruction. Outputs from these memories will now be vectors, 3 times wider than before. The parity check verifier 914 and the output buffer 916 will also be suitably vectorized with all processing suitably parallelized.

Figures 13, 14:
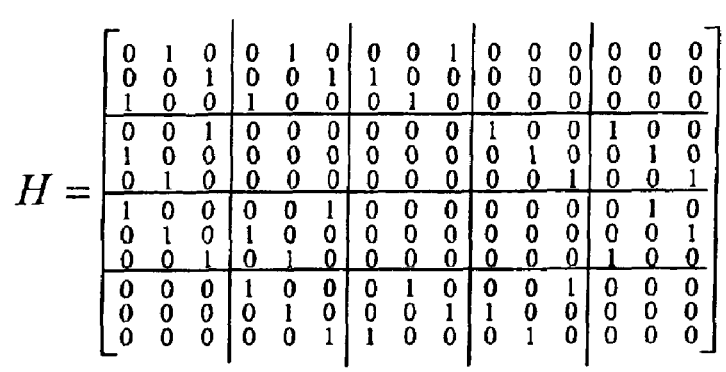
FIG. 13 illustrates the effect of replacing the 3×3 identity matrices shown in FIG. 11 with cyclic permutation matrices in accordance with one exemplary embodiment of the present invention.
FIG. 14 illustrates how the edges in the code shown in FIG. 13 can be enumerated in order from the variable node side, and how the same edges will appear from the constraint node side after being subject to a cyclic permutation in accordance with the invention.

Let us now consider the introduction of rotations into our example. This can be illustrated by replacing each of the 3×3 identity matrixes shown in FIG. 11 with 3×3 cyclic permutation matrixes as shown in FIG. 13. Note that there are three possibilities for the cyclic permutation matrix used in FIG. 13. It is possible to indicate the particular permutation matrix to be substituted for an identity matrix by indicating whether the permutation matrix has a "1" located in the first, second or third position in the first row of the permutation matrix. For example, in the case of matrix 1302, beginning at the top left and proceeding to the bottom right corner (vector constraint socket order) the rotations could be specified by the sequence (2, 2, 3, 3, 1, 1, 1, 3, 2, 1, 2, 3).

FIG. 14 illustrates the effect of performing the cyclic permutation (rotation) on the constraint node side. Since the permutation is performed from the constraint node side, the relationship between the edges, e.g., ordering, from the variable node side remains unchanged as shown in rows 1402', 1402" and 1402'". From the constraint side, however, the permutation results in edges within a column, e.g., the edges within a specific vector edge, being reordered as shown in rows 1404', 1404", 1404'". This produces interconnections between nodes corresponding to different copies of the projected graph.

Consider, for example, column 1 of rows 1404 in relationship to column 1 of rows 1104 of FIG. 11. Note that as a result of the vector edge permutation, operation, constraint node $C_{1,1}$ is now connected to edge (2,1) as opposed to edge (1,1), constraint node $C_{2,1}$ is coupled to edge (3,1) as opposed to edge (2,1) and constraint node $C_{3,1}$ is coupled to edge (1,1) as opposed to edge (3,1).

We discussed above how to vectorize decoder 900 to decode Z parallel copies of the projected graph. By introducing switches into the message paths to perform rotations, we decode the LDPC code defined in FIG. 13.

Figure 15:
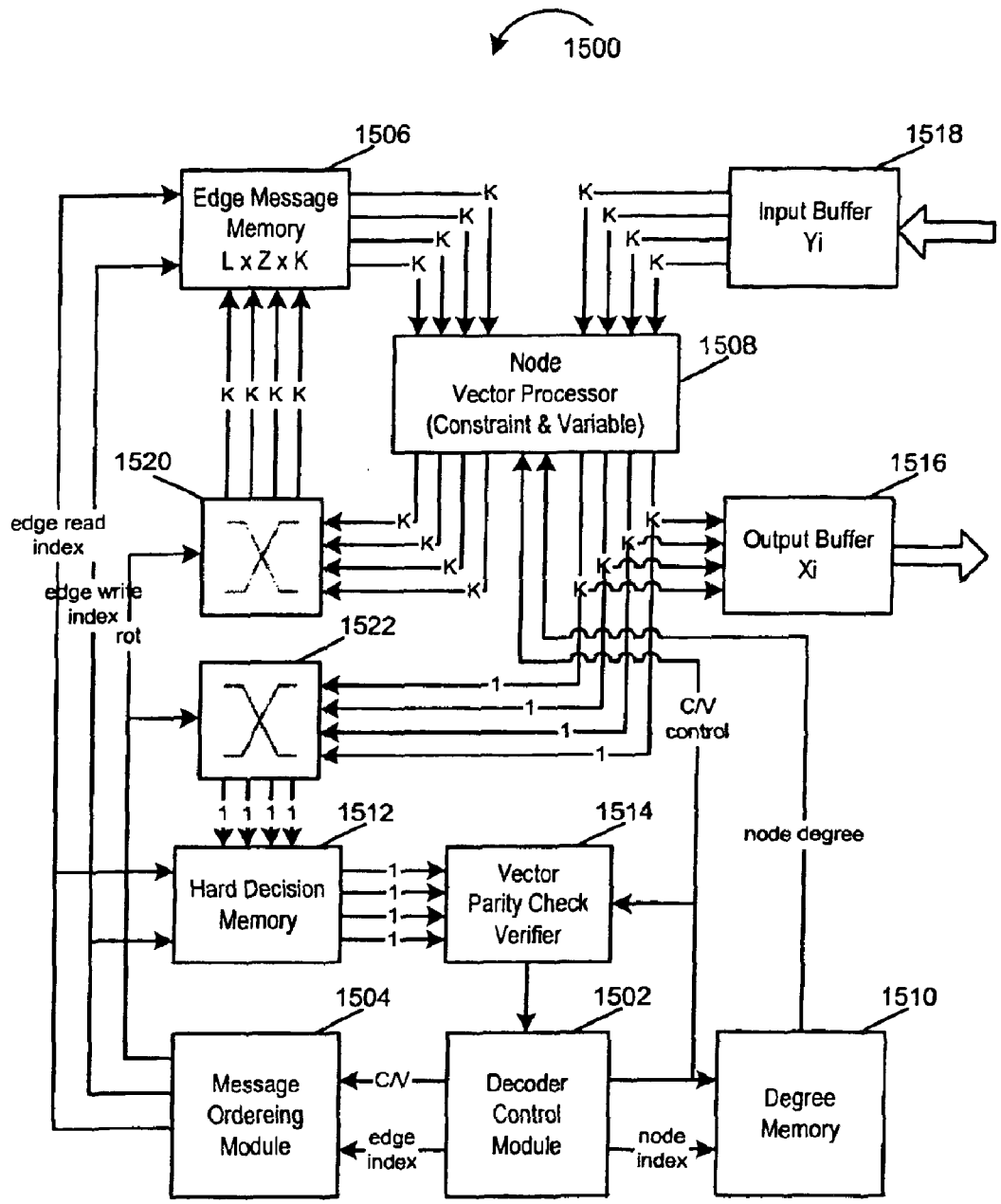
FIG. 15 illustrates an LDPC decoder implemented in accordance with the present invention that vectorizes the decoder of FIG. 9.

FIG. 15 illustrates a decoder incorporating various features of the present invention. The decoder 1500 fully vectorizes, with rotations, the decoder 600. Note that the figure indicates Z=4 whereas our example has Z=3, in general we may have any Z≧1 but in practice Z values of the form $2^k$ for integer k are often preferable. Similarities with decoder 600 are apparent. In particular the decoder control module 1502 and the node degree memory 1510 function in the same or a similar manner as their respective counterparts 902 and 910 in decoder 900. For example, to decode LDPC code defined in FIGS. 13 and 14 the operation of these components would be exactly the same as their counterparts in decoder 900 when decoding the example graph 600. The edge message memory 1506 and hard decision memory 1512 are vectorized versions of their counterparts 906 and 912 in decoder 900. Whereas in decoder 900 the memories stored single units (K bit messages or bits) the corresponding memories in decoder 500 store sets, i.e., vectors, messages, resulting in e.g., Z×K bit messages being stored. These vectors are written or read as single units using SIMD instructions. Thus the message identifiers sent to these modules from the message ordering module 1504 are equivalent or similar to those in decoder 900. The message ordering module 1504 has the additional role, beyond what its counterpart 904 had in decoder 900, of storing and providing the permutation, e.g., rotation, information. Recall that in decoding example 600 decoder 900 stored in its message ordering module 904 the edge sequence (1,4,7,2, 9,11,3,5,12,6,8,10). Consider using decoder 1500, to decode the code of FIGS. 13 and 14. The message ordering module 1504 would store the same above sequence for accessing message vectors during constraint node processing, and also store the sequence (2, 2, 3, 3, 1, 1, 1, 3, 2, 1, 2, 3) which describes the rotations associated to the same sequence of vector messages. This sequence serves as the basis to generate the rot signal which is used by the message ordering module 1504 to cause the switches 1520 and 1522 to rotate vector messages and vector hard decision bits respectively. (Note that the hard decision bits are provided only during variable node processing mode.) The vector parity check verifier 1514 is a vector version of its counterpart 914 in decoder 900. Note that the output convergence signal is a scalar, as before. The output buffer 1516 serves the same purpose as buff 916, but output data is written as vectors. The vector node processor 1508, is, e.g., Z node processors, each as in 908, in parallel. These nodes would share the deg signals and C/V control signal from the decoder control module 1502.

In order to facilitate the ability to output either soft or hard decoder decisions the soft decisions generated by the variable processing unit are supplied to a soft decision input of buffer 1516. Thus, at any time prior to completion of decoding, soft decisions may be obtained form the output of buffer 1516.

Consider further how decoder 1500 would function decoding the example of FIGS. 13 and 14. Initially the message edge memory 1506 is populated with 0s. The decoder control module 1502 first toggles into variable node processing mode. The message edge memory 1506 vectors (all 0s at this point) are read out in order and delivered to the vector node processor 1508 for variable node processing. The vector node processor 1508 then outputs the received values alone along each edge from a variable node, we will use y to denote these first messages to indicate this. Thus, the outgoing vectors would be $(y_{1,i}, y_{2,i}, y_{3,i})$ for i=1, . . . ,12 in increasing order. The rot signal is used to control message re-ordering performed by switching circuits 1520, 1522. The rot signal from the message ordering module 1504 will cause the messages in the vectors to be rotated to produce processed vectors as follows: $(y_{2,1}, y_{3,1}, y_{1,1})$, $(y_{3,2}, y_{1,2}, y_{2,2})$. $(y_{1,3}, y_{2,3}, y_{3,3})$ $(y_{2,4}, y_{3,4}, y_{1,4})$, $(y_{3,5}, y_{1,5}, y_{2,5})$, $(y_{1,6}, y_{2,6}, y_{3,6})$, $(y_{3,7}, y_{1,7}, y_{2,7})$, $(y_{2,8}, y_{3,8}, y_{1,8})$, $(y_{1,9}, y_{2,9}, y_{3,9})$, $(y_{3,10}, y_{1,10}, y_{2,10})$ $(y_{1,11}, y_{2,11}, y_{3,11})$ $(y_{2,12}, y_{3,2}, y_{1,12})$. Once the processed vectors are written into edge memory 1506, in the indicated order, the decoder control module 1502 will toggle into constraint mode. The stored vector messages will then be read out in order (1,4,7,2,9,11,3,5,12,6,8,10). Thus, they will be presented to the vector node processor 1508 in the order $(y_{2,1}, y_{3,1}, y_{1,1})$, $(y_{2,4}, y_{3,4}, y_{1,4})$, $(y_{3,7}, y_{1,7}, y_{2,7})$, $y_{3,2}, y_{1,2}, y_{2,2})$, $(y_{1,9}, y_{2,9}, y_{3,9})$, $(y_{1,11}, y_{2,11}, y_{3,11})$, $(y_{1,3}, y_{2,3}, y_{3,3})$, $(y_{3,5}, y_{1,5}, y_{2,5})$ $(y_{2,12}, y_{3,12}, y_{1,12})$, $(y_{1,6}, y_{2,6}, y_{3,6})$ $(y_{2,8}, y_{3,8}, y_{1,8})$ $(y_{3,10}, y_{1,10}, y_{2,10})$. The vector node processor 1508 is implemented as three (Z=3) node processors in parallel. The $1^{st}$ element (message) of each message vector (set of messages) is delivered to the $1^{st}$ node processor; the $2^{nd}$ message is delivered to the $2^{nd}$ processor; and the $3^{rd}$ message is delivered to the $3^{rd}$ processor, respectively. The deg signal, which indicates the degree of the current node being processed, is supplied by the degree memory 1510 to the three parallel processors of vector node processor 1508. At this point the deg signal indicates that constraints are (all) degree 3 so the $1^{st}$ processor would process $y_{2,1}$, $y_{2,4}$, and $y_{3,7}$ for its first constraint node and $y_{3,2}$, $y_{1,9}$, and $y_{1,11}$ for its second. Similarly, the $2^{nd}$ processor would process $y_{3,1}$, $y_{3,4}$, and $y_{1,7}$ for its first constraint node and $y_{1,2}$, $y_{2,9}$, and $y_{2,11}$ for its second.

Let $m_{i,j}$ denote the outgoing message corresponding to the incoming $y_{i,j}$. As the vectors are emerging from the vector node processor 1508, the rot signal to switch 1520 will cause the vectors to be reordered so that the previous rotation is reversed, hence they arrive at the edge memory as $(m_{1,j}, m_{2,j}, m_{3,j})$, in the order j=1,4,7,2,9,11,3,5,12,6,8,10. The messages are written back into memory according to the message identifier order with which they were read, so after writing they appear in memory as $(m_{1,j}, m_{2,j}, m_{3,j})$ in order j=1, . . . ,12. The message ordering module 1504 now toggles into variable node processing mode in response to a C/V signal supplied by decoder control module 1502. The message vectors are then read out in order j=1, . . . ,12 and delivered to the vector node processor 1508 for variable node processing. This completes an iteration.

During variable node processing the vector node processor 1508 also outputs soft decoded vectors which are stored in the output buffer 1516. It also outputs hard decisions which are supplied to switching circuit 1522. The vectors of one bit hard decisions undergo the same rotation operation as the message vectors at the corresponding times. The rotated hard decision vectors produced by switching circuit 1522 are then arrayed in the hard decision memory 1512 where they are stored. As a result of applying the same rotation applied to the message vectors, the hard decisions may be read out in the same order as the vector messages are read out during constraint node processing. During constraint node processing the hard decisions are delivered to the vector parity check verifier 1514 which performs Z parity checks in parallel. If all parity checks are satisfied then the convergence signal, CON is generated and emitted. In response to receiving the convergence signal indicating successful decoding, the decoder control module 1502 stops the decoding process.

It should be apparent that there are many variations to decoder 1500 that each embody the current invention. For example, the switch 1520 could have instead been placed along the data path between the edge message memory 1506 and the vector node processor 1508. Similarly, switch 1522 could have instead been placed along the data path between the hard decision memory 1512 and the vector parity check verifier 1514. Such a replacement would also involve appropriate adjustment of the timing of rot signal. The hard decision memory 1512, the vector parity check verifier 1514 and the attendant data paths need not be used and are eliminated for decoder embodiments that perform a fixed number of iterations and therefore do not require convergence detection. Many further variations will be apparent to those skilled in the art in view of the present invention.

Figure 16:
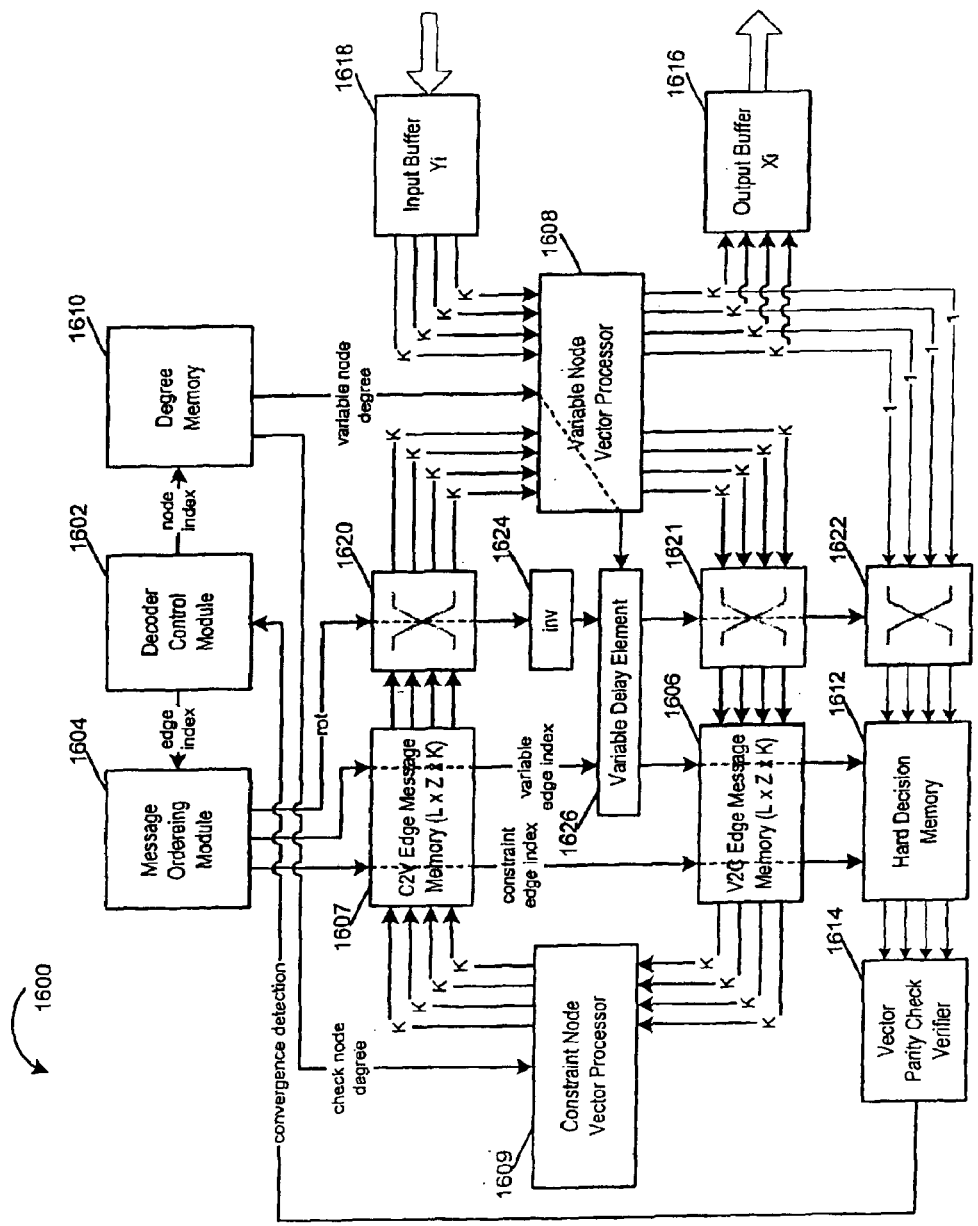
FIGS. 16 and 17 illustrate other LDPC decoders implemented in accordance with the present invention.

FIG. 16 illustrates a decoder 1600 which is implemented in accordance with another embodiment of the present invention. The decoder 1600 includes many elements which are the same as, or similar to, the elements of the decoder 1500. Accordingly, for the purposes of brevity, such elements will be identified using the same reference numbers as used in FIG. 15 and will not be discussed again in detail. The decoder 1600 is capable of performing both variable node and constraint node processing operations, e.g., message updating operations, at the same time, e.g., simultaneously and independently. In contrast to the FIG. 15 decoder implementation which may be described as a side-to-side decoder because of the way it toggles between variable node and constraint node processing iterations, the decoder 1600 can be described as an asynchronous iteration decoder since the variable node and constraint node processing operations can be performed independently, e.g., simultaneously.

The decoder circuit 1600 includes a decoder control module 1602, a message ordering module 1604, a first switching circuit 1621, V2C edge message memory 1606, a constraint node vector processor (e.g., Z-constraint node processors in parallel) 1609, a second switching circuit 1620, C2V edge message memory 1607, a variable node vector processor 1608 (e.g., Z-variable node processors in parallel), a hard decision memory 1612, and a third switch 1622 coupled together as illustrated in FIG. 16.

Various embodiments of individual constraint node processors and individual variable node processors, Z of which can be used in parallel to implement the constraint node vector processor 1609 and variable node processor 1608, respectively, are described in detail in U.S. Provisional Patent Application 60/328,469, titled "Node Processors For Use in Parity Check Decoders", which is being filed on even date herewith, and which is hereby expressly incorporated by reference. The inventors of the present patent application are also the named inventors on the incorporated provisional patent application.

In order to support independent and/or parallel updating of constraint and variable messages in the FIG. 16 embodiment separate edge message memories 1606, 1607 and switching circuits 1620, 1621 are used to support constraint node and variable node processing operations, respectively. As in the FIG. 15 embodiment, each of the message memories 1606, 1607 are capable of storing L (Z×K-bit) vector messages. Each vector message, e.g., column of Z K-bit messages, in the memories 1606, 1607, can be read from or written to in a single read or write operation.

V2C edge message memory 1606 is used to store V2C messages and therefore has a write input coupled to the output of the switching circuit 1621 which receives data from ariable node vector processor 1608. The C2V message memory 1607 is used to store C2V edge messages and therefore has a write input coupled to the output of the constraint node vector processor 1609.

Switches 1620 and 1621 are used to couple the variable node vector processor 1608 to the input of V2C edge message memory and the output of the C2V edge message memory, respectively. In one particular embodiment message vectors are stored in vector constraint socket order. Message vectors are written into C2V edge message memory 1607 and read out of V2C edge message memory 1606 in vector constraint socket order, i.e., linearly, thus no external control is required (edge index output from decoder control module 1602 passes through message ordering module 1604 unchanged to it's constraint edge index output). Message vectors are read out of C2V edge message memory 1607 and written into V2C edge message memory 1606 in vector variable socket order. The message ordering module 1604 generates the variable edge index signal which indicates this ordering. Note that this signal controls reading of C2V edge message memory 1607 and is delivered to V2C edge message memory 1606 after being delayed. The delay accounts for the time required for processing performed by switches 1620 and 1621 and the vector variable node processor 1608. This delay may be a function of the degree of the node being processed, as indicated in FIG. 16 by the variable node degree signal.

To avoid processing pipeline stalls due to variable delay both constraint and variable nodes are ordered such that nodes of the same degree are processed in a contiguous fashion. Further reduction in pipeline stalls occurring on the boundary of node groups with different degrees can be achieved by sorting node groups by degree in a monotonic fashion e.g., increasing or decreasing degree order. For implementation simplicity embodiments 900, 1500 and 1600 assume increasing degree order.

In the particular embodiment illustrated in FIG. 16 vectors are stored in vector constraint node rotation order. Switch 1620 rotates the messages in each vector into variable rotation as each C2V vector message proceeds to variable node vector processor 1608 and then switch 1621 applies the inverse rotation to the outgoing V2C vector message corresponding to the same vector edge. The rot signal delivered to switch 1620 is delivered to switch 1621 via rotation inversion circuit 1624 after a delay matched to the processing time in the vector constraint node processor. This delay may depend on the constraint node degree, as indicated by the constraint node degree signal output by degree memory 1610.

The decoder 1600 includes decoder control module 1602. The decoder control module operates in a similar manner to the previously discussed control module 1502. However, in 1602 no C/V control signal is generated. The edge index generation function can be provided by a counter which cycles through the entire set of vector edges before starting over.

In addition to outputting the soft decisions, hard decisions are generated, one per edge, by each of Z-variable node processing units in the vector variable node processor 1608 each time a vector V2C message is generated. While the vector messages are written into the V2C edge message memory 1606, the Z×1 bit hard decision outputs are written into the hard decision output memory 1612 after being rotated by switch 1622. Switch 1622 and hard decision memory 1612 operate under the same control signals as switch 1621 and V2C edge message memory 1612, respectively.

The resulting Z×1 rotated vectors are delivered to the vector parity check verifier 1614 which includes Z parity check verifiers connected in parallel. The verifier 1614 determines if the parity checks are satisfied and if all are satisfied then a convergence signal is generated and sent to the decoder control module. In response to receiving a signal indicating convergence, the decoder control module stops decoding of the received codeword. In the embodiment 1600 the convergence detection signal is available one iteration after a codeword has been written to the output buffer since constraint verification for data from iteration N is done during iteration N+1 and the convergence signal is available upon completion of iteration N+1.

Figure 17:
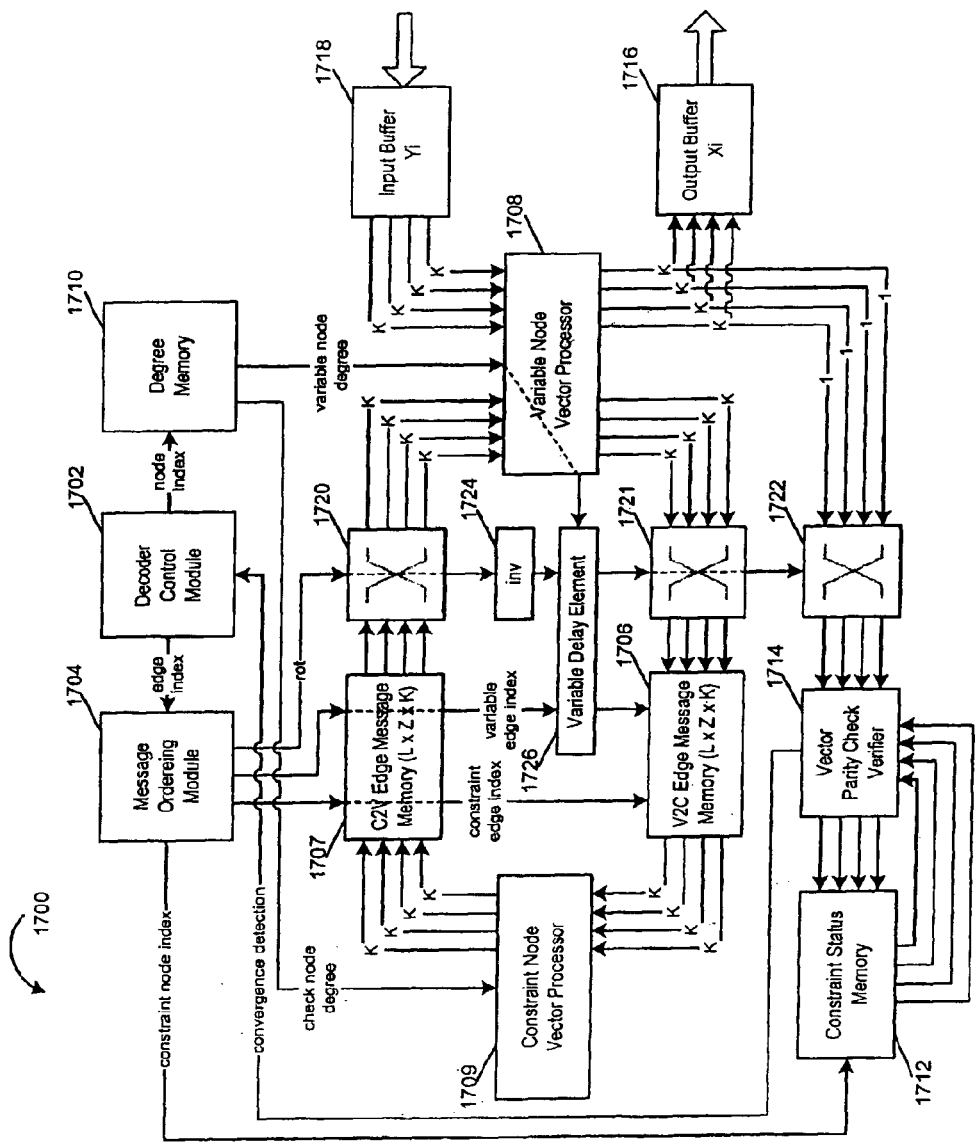

In the decoder 1600 but which employs different convergence detection circuitry FIG. 17 illustrates an embodiment similar to the decoder 1700 constraint verification is accomplished "on the fly" as the Z×K-bit output values X are written to the output buffer 1716. In this case memory block 1712 keeps track of constraints status as vector constraints are updated by hard decision output from variable node processor 1708. Each constraint status memory location corresponds to a codeword parity check constraint. On the last update of any constraint status location these parity check values are verified. If all verifications during iteration N are satisfied then a convergence signal will be generated and output by the vector parity check verifier 1714 immediately after iteration N. This will qualify to the decoder control module 1702 that data in output buffer 1616 is valid. In the FIG. 17 embodiment the message ordering module 1704 generates an additional signal defining constraint node index (as opposed to edge index) which is not generated in the FIG. 16 embodiment. The constraint node index identifies the constraint node destination of the current V2C message. This field serves as an index to constraint status memory 1712 to which it is supplied.

While requiring a little more circuitry than the FIG. 15 embodiment, the FIG. 16 and FIG. 17 embodiments have the advantage of more efficient use of the vector constraint and variable node processors 1609/1709, 1608/1708 since both vector node processors are utilized fully during each processing iteration. In addition, decoding time is reduced as compared to the FIG. 15 embodiment since constraint and variable node processing is performed in parallel, e.g., simultaneously.

The above described decoding methods allow for message passing decoding, e.g., LDPC decoding, to be performed using software and general purpose computers capable of supporting SIMD operations. In such embodiments, one or more parallel processors serve as vector processing units or, hardware within a single processor may be used to perform multiple vector processing operations in parallel. In such embodiments, the edge memory, permutation map and information on the number of messages per node may all be stored in a common memory, e.g., the computers main memory. The message passing control logic and decoder control logic may be implemented as software routines executed on the computer's processing unit. In addition, the switching device may be implemented using software and one or more SIMD processing instructions.

The above described LDPC decoding methods allow for LDPC decoding to performed on various hardware platforms such as Field Programmable Gate Arrays or in an Application Specific Integrated Circuit. The present invention is especially useful in these settings where the simple parallelism can be explicitly exploited.

Numerous additional variations on the decoding methods and apparatus of the present invention will be apparent to those skilled in the art in view of the above description of the invention. Such variations are to be considered within the scope of the invention.

What is claimed is:

1. An apparatus for performing parity check message passing decoding operations, the apparatus comprising:
   a message source for supplying at least one set of Z K-bit messages from any of at least L sets of Z K-bit messages, where Z is a positive integer greater than one and K and L are non-zero positive integers;
   a node processor including a plurality of node processing units, each node processing unit for performing at least one of a parity check constraint node processing operation and a parity check variable node processing operation; and
   a switching device coupled to the message source and to the node processing unit, the switching device for passing sets of Z K-bit messages between said message source and said node processor and for re-ordering the messages in at least one of said passed sets of messages in response to switch control information.

2. The apparatus of claim 1,
   wherein said message source is a memory device; and
   wherein each of said plurality of node processing units is a variable node processing unit.

3. The apparatus of claim 1, further comprising:
   a message ordering control module coupled to said switching device for generating said switch control information used to control the reordering of messages in said at least one set of messages.

4. The apparatus of claim 3, wherein the switching device includes circuitry for performing a message rotation operation to reorder messages included in a set of messages.

5. The apparatus of claim 3, wherein the message ordering control module stores information on the order sets of messages are to be received from said message source and information indicating what reordering of messages is to be performed by said switch on individual sets of messages received from said message source.

6. The apparatus of claim 3, wherein the message ordering control module is further coupled to said message source and sequentially generates set identifiers, each set identifier controlling the message source to output a set of messages.

7. The apparatus of claim 6, wherein each set identifier includes a single memory address.

8. The apparatus of claim 3, wherein said plurality of node processing units includes Z node processing units arranged in parallel, each one of the Z node processing units operating in parallel to process a different message in each set of Z messages passed between said message source and said node processor.

9. The apparatus of claim 8, wherein said message source includes an identifier input which allows each set of messages to be addressed as a unit.

10. The apparatus of claim 8, wherein each of said plurality of node processing units performs a variable node processing operation.

11. The apparatus of claim 8,
    wherein the decoder control device is further coupled to said message ordering control module.

12. The apparatus of claim 3, further comprising a decoder control module coupled to the message ordering module, the decoder control module including means for supplying information to the message ordering module used to control the order in which each of the L sets of Z messages are output by said message source.

13. The apparatus of claim 12, further comprising a degree memory coupled to the node processor for storing a set of node degree information.

14. The apparatus of claim 13, wherein the control device further generates a node index used to determine which node degree information in the stored set of node degree information is to be supplied to the node processor at any given time.

15. The apparatus of claim 1, further comprising:
    a second node processor coupled to said message source, the second node processor including a second plurality of node processing units, each of the second plurality of node processing units for performing constraint node processing operation.

16. The apparatus of claim 15, further comprising:
    a parity check verifier, coupled to said first node processor, for determining from an output of each of the first plurality of processing units included therein, when a parity check decoding operation has been successfully completed.

17. A method of performing parity check message passing decoding processing comprising the steps of:
    maintaining L sets of k-bit messages in a message storage device, each set of K-bit messages including first through z messages, where L and z are positive integers greater than one and K is a non-zero positive integer;
    outputting one of said sets of K-bit messages from the message storage device;
    performing a message reordering operation on said read set of K-bit messages to produce a reordered set of Z K-bit messages; and
    supplying, in parallel, the Z messages in the reordered set of messages to a vector processor; and
    operating the vector processor to perform parity check message passing decoder operations using the Z supplied messages as input.

18. The method of claim 17, further comprising: generating a message set identifier indicating the set of Z messages to be output by the message storage device.

19. The me-hod of claim 18, wherein the step of outputting one of said sets of K-bit messages includes: performing a SIMD output operation using said message set identifier to identify the set of messages to be output.

20. The method of claim 17, further comprising: performing a second message reordering operation, the second message reordering operation being performed on the generated set of Z decoder messages to produce a reordered set of generated decoder messages.

21. The method of claim 20, wherein the step of performing a second message reordering operation includes performing the inverse of the message reordering operation performed on said set of K-bit messages output by the message storage device.

22. The method of claim 21, wherein said message reordering operation is performed as a function of message set permutation information that includes cyclic rotation information.

23. The method of claim 17, further comprising:

accessing stored message set permutation information; and wherein the step of performing a message reordering operation includes the step of:

performing said reordering as a function of the accessed stored message set permutation information.

24. The method of claim 17, wherein said parity check message passing decoder operations are variable node low density parity check processing operations, each variable node processing operation including generating a decision value, and wherein the method further comprises:

examining decision values generated by operating the vector processor to determine if a decoding condition has been satisfied.

25. A method of performing parity check message passing decoding processing, the method comprising the steps of:

operating a variable node vector processor to generate a set of Z K-bit messages, where Z is a positive integer greater than one and K is a non-zero positive integer; and performing a message reordering operation on the generated set of Z K-bit messages to produce a reordered set of Z K-bit messages.

26. The method of claim 25, wherein the step of operating the node vector processor to generate a set of Z K-bit messages, includes the step of:

performing, in parallel, Z node processing operations, each node processing operation generating one message in said set of Z X-bit messages.

27. The method of claim 26, wherein performing a message reordering operation on the generated set of Z K-bit messages includes:

rotating the messages in the set of Z K-bit messages by performing a switching operation to reorder the messages in the set of messages.

28. A method of performing parity check decoder operations, the method comprising:

performing a message output operation to output a set of messages;

performing a message reordering operation on the output set of messages to produce a reordered set of messages;

supplying the reordered set of messages to a node processor including a plurality of variable node processing units arranged in parallel; and operating the plurality of variable node.

* * * * *